United States Patent
Tyminski et al.

(10) Patent No.: US 8,572,518 B2
(45) Date of Patent: Oct. 29, 2013

(54) PREDICTING PATTERN CRITICAL DIMENSIONS IN A LITHOGRAPHIC EXPOSURE PROCESS

(75) Inventors: Jacek K. Tyminski, Mountain View, CA (US); Raluca Popescu, San Mateo, CA (US)

(73) Assignee: Nikon Precision Inc., Belmont, CA (US)

( * ) Notice: Subject to any disclaimer, the term of this patent is extended or adjusted under 35 U.S.C. 154(b) by 0 days.

(21) Appl. No.: 13/313,749

(22) Filed: Dec. 7, 2011

(65) Prior Publication Data

US 2012/0331427 A1  Dec. 27, 2012

Related U.S. Application Data

(60) Provisional application No. 61/500,520, filed on Jun. 23, 2011.

(51) Int. Cl.
*G06F 17/50* (2006.01)

(52) U.S. Cl.
USPC .......... 716/52; 716/50; 716/51; 716/53; 716/54; 716/55

(58) Field of Classification Search
None
See application file for complete search history.

(56) References Cited

U.S. PATENT DOCUMENTS

| | | | |
|---|---|---|---|
| 5,528,118 A | 6/1996 | Lee | |
| 5,623,853 A | 4/1997 | Novak et al. | |
| 5,668,672 A | 9/1997 | Oomura | |
| 5,689,377 A | 11/1997 | Takahashi | |
| 5,835,275 A | 11/1998 | Takahashi et al. | |
| 5,874,820 A | 2/1999 | Lee | |
| 5,892,117 A | 4/1999 | Theriot | |
| 6,902,855 B2 * | 6/2005 | Peterson et al. | 430/30 |
| 7,266,800 B2 * | 9/2007 | Sezginer | 716/52 |
| 7,382,447 B2 * | 6/2008 | Mieher et al. | 356/125 |
| 7,403,264 B2 * | 7/2008 | Jeunink et al. | 355/67 |
| 7,587,704 B2 * | 9/2009 | Ye et al. | 716/51 |
| 7,655,368 B2 * | 2/2010 | Finders et al. | 430/30 |
| 7,656,512 B2 * | 2/2010 | Mieher et al. | 356/125 |
| 7,747,978 B2 * | 6/2010 | Ye et al. | 716/50 |

(Continued)

FOREIGN PATENT DOCUMENTS

| | | |
|---|---|---|
| JP | 8166475 A | 6/1996 |
| JP | 8171054 A | 7/1996 |

(Continued)

OTHER PUBLICATIONS

Nikon, "Immersion Lithograpy Technology", http://www.nikon.com/about/technology/core/optics/immersion_e/index.htm, Mar. 2008, pp. 1-2.

(Continued)

*Primary Examiner* — A. M. Thompson
(74) *Attorney, Agent, or Firm* — Andrew M. Calderon; Roberts Mlotkowski Safran & Cole, P.C.

(57) ABSTRACT

A method for predicting pattern critical dimensions in a lithographic exposure process includes defining relationships between critical dimension, defocus, and dose. The method also includes performing at least one exposure run in creating a pattern on a wafer. The method also includes creating a dose map. The method also includes creating a defocus map. The method also includes predicting pattern critical dimensions based on the relationships, the dose map, and the defocus map.

29 Claims, 28 Drawing Sheets

(56) References Cited

U.S. PATENT DOCUMENTS

| | | | |
|---|---|---|---|
| 8,175,831 B2 * | 5/2012 | Izikson et al. | 702/83 |
| 8,250,498 B2 * | 8/2012 | Huang et al. | 716/55 |
| 2005/0240895 A1 * | 10/2005 | Smith et al. | 716/19 |
| 2005/0273753 A1 * | 12/2005 | Sezginer | 716/21 |
| 2010/0058263 A1 | 3/2010 | Tyminski et al. | |
| 2010/0125823 A1 | 5/2010 | Renwick et al. | |

FOREIGN PATENT DOCUMENTS

| | | |
|---|---|---|
| JP | 8330224 A | 12/1996 |
| JP | 8334695 A | 12/1996 |
| JP | 10003039 A | 1/1998 |
| JP | 10020195 A | 1/1998 |

OTHER PUBLICATIONS

Owa, S. et al., "Immersion Lithography: Out of the Lab and Into the Fab", http://www.future-fab.com, Future Fab International, Issue 19, Jun. 28, 2005, 4 pages.

"Bossung Plots", http://www.si2.org/openeda.si2.org/dfmcdictionary/index.php/Bossung_Plots, DFMC Dictionary, Si2 Inc., Feb. 6, 2008, pp. 1-4.

Hazelton, A. et al., "Double-patterning requirements for optical . . . for optical extension without double patterning", J. Micro/Nanolith, vol. 8, Jan.-Mar. 2009, 11 pages.

* cited by examiner

Pattern Gaps $$\Delta CD_{spGap} = \left( \Delta CD_{litho}^2 + 2\Delta CD_{depo}^2 \right.$$
$$\left. + \left\{ \frac{3}{2}[P - 2(\overline{L_{litho}} + \overline{L_{depo}})] \right\}^2 \right)^{1/2}$$

← 1180

Pattern Lines ← 1181

$$\Delta CD_{spSpacer} = \Delta CD_{depo}.$$

Lines Overlay ← 1182

$$\Delta OL_{spSpacer} = \left( \Delta OL_{litho}^2 + \frac{\Delta CD_{litho}^2}{4} + \frac{\Delta CD_{depo}^2}{4} \right.$$
$$\left. + \left[ \frac{3}{2}(\overline{\Delta L_{litho}} + \overline{\Delta L_{depo}}) \right]^2 \right)^{1/2}.$$

PREDICTING PATTERN CRITICAL DIMENSIONS IN A LITHOGRAPHIC EXPOSURE PROCESS

CROSS REFERENCE TO RELATED APPLICATION

This application claims priority to U.S. Provisional Application No. 61/500,520, filed Jun. 23, 2011, the contents of which are incorporated by reference herein in their entirety.

FIELD OF THE INVENTION

The present invention relates generally to monitoring pattern dimensions created by lithographic scanning and, more particularly, to monitoring and recording pattern critical dimensions in situ during the exposure process.

BACKGROUND

Photolithography is a process commonly used in defining features during semiconductor wafer processing, such as used in the fabrication of integrated circuits (ICs). Photolithography generally involves applying a photoresist material (e.g., resist) to a wafer, exposing the resist using a pattern of applied radiation (e.g., light), developing the resist, etching a material of the wafer through the patterned resist, and removing the resist after etching. In photolithography, a critical dimension (CD) is a characteristic length that corresponds to various features critical to the IC performance that needs to be patterned on the surface, e.g., a minimum feature width and/or a minimum spacing between features. CD control of lithography patterns is an important aspect of the lithography process to ensure that the end product meets the design specification.

Typical methods to record lithography pattern critical dimensions, e.g., for CD control, are performed ex-situ. Such ex situ methods start with exposing the pattern in the photoresist (e.g., resist), then developing the resist pattern, and finally measuring the pattern dimensions with the metrology tool such as a CD scanning electron microscope (SEM) or ellipsometer. There are numerous drawbacks with such ex situ methods. For example, there is a significant time delay between pattern exposure and obtaining the actual pattern critical dimensions, since the pattern is created using a lithography system and the actual pattern critical dimensions are later measured using separate metrology tools. An additional drawback is that ex situ methods require extra tooling, such as the metrology tools that generate the pattering performance record.

SUMMARY

In a first aspect of the invention, there is a method of predicting pattern critical dimensions in a lithographic exposure process. The method includes defining relationships between critical dimension, defocus, and dose. The method also includes performing at least one exposure run in creating a pattern on a wafer. The method also includes creating a dose map. The method also includes creating a defocus map. The method also includes predicting pattern critical dimensions based on the relationships, the dose map, and the defocus map.

In another aspect of the invention, there is a system for predicting pattern critical dimensions in a lithographic exposure process. The system includes a computing device configured to: create a dose map and a defocus map based on data from at least one exposure run that creates a pattern on a wafer; and predict pattern critical dimensions based on the dose map, the defocus map, and predetermined relationships between critical dimension, defocus, and dose.

In another aspect of the invention, a computer program product comprises program code stored in a computer readable medium that, when executed on a computing device, causes the computing device to: create a dose map and a defocus map based on data from at least one exposure run that creates a pattern on a wafer; and predict pattern critical dimensions based on the dose map, the defocus map, and predetermined relationships between critical dimension, defocus, and dose.

BRIEF DESCRIPTION OF THE DRAWINGS

FIG. 11B shows exemplary spacer errors in accordance with aspects of the invention;

DETAILED DESCRIPTION OF EMBODIMENTS OF THE INVENTION

Figure 1A:
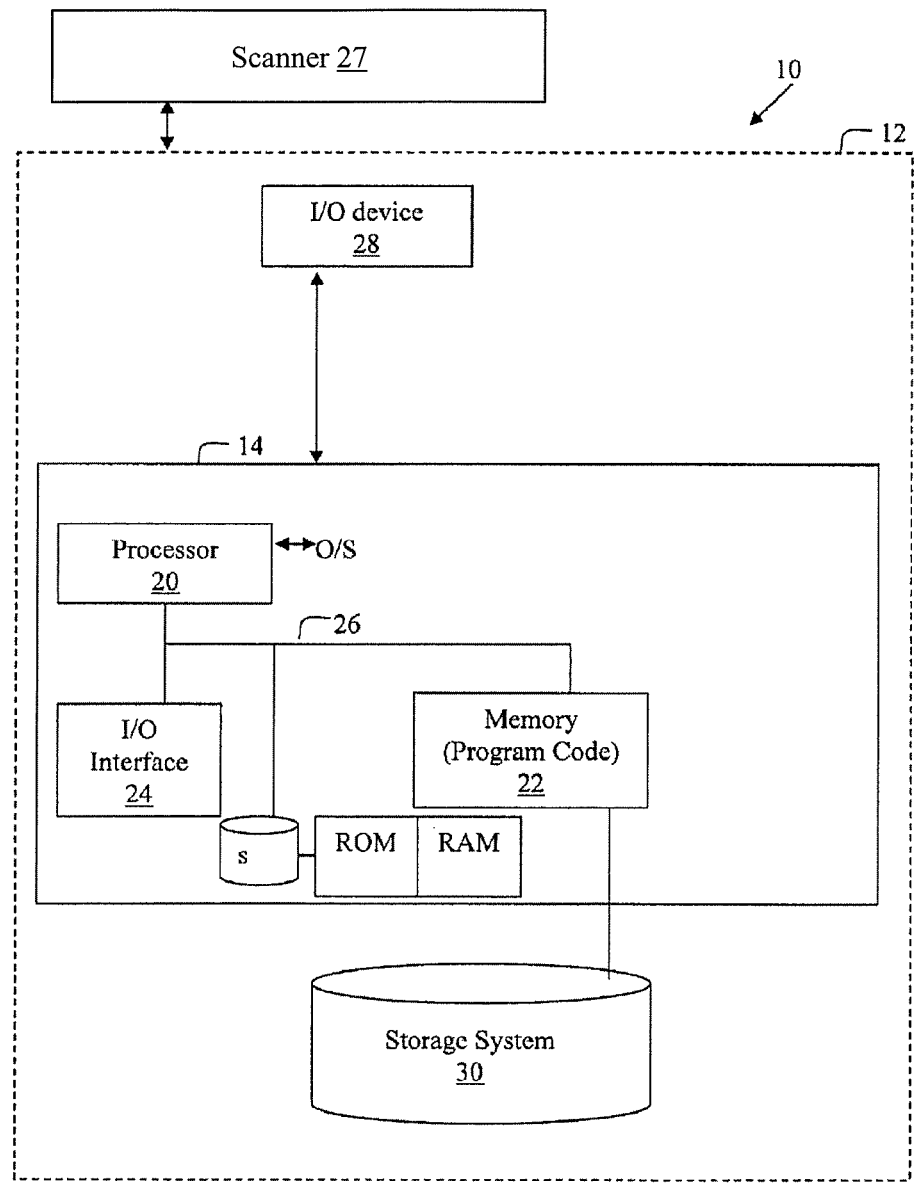
FIG. 1A shows an illustrative environment for implementing the steps in accordance with aspects of the invention.

The present invention relates generally to monitoring pattern dimensions created by lithographic scanning and, more particularly, to monitoring and recording pattern critical dimensions in situ during the exposure process. According to aspects of the invention, methods and systems are provided for monitoring and recording the pattern critical dimensions during the exposure process, e.g., during operation of the scanner apparatus that creates the patterns. In embodiments, the pattern critical dimensions are determined in situ, e.g., while the wafer is being processed in the scanner apparatus, by comparing defocus and dose traces that are generated by the scanner to predetermined relationships between defocus, dose, and critical dimension. Implementations of the invention include constructing sets of Bossung curves that define a relationship between CD, defocus, and dose, constructing defocus and dose maps from data obtained during exposure runs, and predicting pattern CDs based on the Bossung curves and defocus and dose maps. In this manner, the scanner patterning performance is determined and recorded instantaneously during the patterning process, such that the time to generate the patterning performance record is greatly reduced compared to ex situ methods. Moreover, implementations of the invention advantageously eliminate the need for using separate metrology tools to determine the scanner patterning performance.

The ability to determine and evaluate the patterning performance instantaneously in an IC manufacturing flow, as provided by implementations of the invention, affords many benefits to the manufacturer. For example, implementations of the invention:

(i) streamline the IC manufacture in situations where the process control requires quick determination and judgment of the patterning performance;

(ii) eliminate IC manufacturing delays caused by the need to wait for metrology tools, e.g., when metrology tools are occupied or unavailable;

(iii) provide information for making a decision whether to continue with a next step in multi-exposure patterning or repeat the patterning based on the CD pattern performance in the preceding steps, e.g., in IC manufacturing processes requiring double or multiple processes (such as Four-Exposure patterning, spacer double patterning, Litho-Freeze-Litho-Freeze patterning, Litho-Etch-Litho-Etch patterning, and similar processes) and in which each exposure run impacts the outcome of the double or multiple exposure process;

(iv) provide relevant information for processes in which IC manufacturing involves directed self assembly of patterns and the pattern exposure on the scanner, preceding the self assembly, determines the outcome of the self assembled patterns; and/or (v) provide diagnostics of scanner performance relative to the imaging process requirements.

As described herein, implementations of the invention provide an in situ method to predict across wafer CD uniformity (AWCDU), as well as a Double Patterning (DP) performance monitor and analyzer. In embodiments, scanner traces are used to predict AWCDU. Aspects of the invention may be used to develop a DP Mapper for predicting the performance of a scanner. In embodiments, DP mapping comprises recording Single Exposure (SE) CD maps with a SE Mapper, and predicting CD maps resulting from a single exposure of patterns across-wafer. In implementations directed to DP flow, there are two single exposures, and combining two SE maps with two exposure overlay data yields a DP map. In implementations directed to multiple exposure flow, such as, for example Quadrupole Exposure flow, there are multiple, single, exposures, and combining multiple SE maps with multiple exposure overlay data yields a multiple exposure map, such as, for example, quadruple exposure map of CD's.

Exemplary System Environment

The present invention may be embodied as a system, method or computer program product and may, for example, take the form of an entirely hardware embodiment, an entirely software embodiment or an embodiment combining software and hardware. The present invention may also take the form of a computer program product embodied in any computer-usable or computer-readable medium. The present invention can also be implemented as a standalone computer at any site, and may run on a standard personal computer, for example.

The computer-usable or computer-readable medium may be, for example, an electronic, magnetic, optical, electromagnetic, infrared, or semiconductor system, apparatus, device, or propagation medium. For example, computer-usable or computer-readable medium may include a tangible storage medium, such as, but not limited to: a computer diskette, a random access memory (RAM), a read-only memory (ROM), an erasable programmable read-only memory (EPROM or Flash memory), a compact disc read-only memory (CDROM), and/or an optical storage device. The computer-usable or computer-readable medium may comprise an apparatus that contains, stores, communicates, propagates, or transports program code for use by or in connection with the instruction execution system, apparatus, or device. The computer program product may comprise program code stored in a computer readable medium that, when executed on a computing device, causes the computing device to perform one or more of the processes described herein. The computer program product can be written in any conventional programming language such as, for example, C++ or the like. Also, the computer program product can be compatible with any operating system such as, for example, Windows™ or Linux™ operating systems.

FIG. 1A shows an illustrative environment 10 for managing the processes in accordance with the invention. To this extent, the environment 10 includes a server 12 that can perform the processes described herein using the computer program code. As should be appreciated by those of skill in the art, the server 12 includes a computing device 14 having one or more processors 20, memory 22, an I/O interface 24, and a bus 26. The memory 22 can include local memory employed during actual execution of the program code, as one non-limiting example. The server 12 and/or computing device 14 can read and/or receive information from a scanner 27, and use this information to predict across-wafer CD distribution of a wafer being processed in the scanner 27. As used herein, the terms scanner and scanner apparatus refer to a photolithography apparatus (e.g., imaging system, exposure apparatus, etc.) used in lithography.

The one or more processors 20 may be dedicated processors programmed for execution of particular processes or combination of processes in accordance with the invention, which may be performed on the server 12 and/or the computing device 14. The server 12 and/or computing device 14 may also be dedicated to particular processes or combination of processes in accordance with the invention. Accordingly, the computing device 14 and/or server 12 can include any combination of general and/or specific purpose hardware (e.g., one or more processors 20) and/or computer program code. The server 12 and/or computing device 14 can communicate over any type of communications link, such as, for example: wired and/or wireless links; any combination of one or more types of networks (e.g., the Internet, a wide area network, a local area network, a virtual private network, etc.); and/or utilize any combination of transmission techniques and protocols.

The computing device also includes an I/O device 28 that may be external to either the computing device 14 or the server 12. The I/O device 28 can be, for example, any device that enables an individual to interact with the computing device 14, e.g., a display (GUI) of a computing device. In embodiments, the user can enter information into the system by way of the GUI (I/O device 28). In one example, the input items can be accessible to the user by a dialog box. In addition, it is contemplated that the GUI (I/O device 28) will lead the user through the input requirements by providing input boxes for textual input or pointer action.

By way of illustration, the GUI (I/O device 28) can accept scanner and mask information, amongst other information. The scanner information can include, for example, user-defined laser wavelength, laser bandwidth, laser spectrum, immersion and dry exposure data, a default index of refraction (for water), pupil intensity, immersion exposure, threshold information (e.g., low intensity information from pupilgram files), polarization information, etc. Mask information may include, for example, editing capabilities for amplitude and phase information, etc., as well as accepting GDS or OASIS mask files.

The server 12 (and/or computing device 14) includes a centralized device repository, e.g., storage system 30. In embodiments, the centralized device repository 30 is configured and/or designed to store the computer code and library information (data) as described below. This allows the system and methods to perform the processes described herein.

CD Relationship to Defocus and Dose

Implementations of the invention employ a link (e.g., relationship) between the operation of scanner subsystems controlling focus and dose and critical dimensions of the patterns imaged by the scanner. This link is through families of CD versus defocus curves for a range of exposure doses. These curves are referred to as Bossung curves. The information to accurately construct these relationships in the form of Bossung curves is obtained by careful calibration of the scanner system setup and careful calibration of the pattern mask. For these conditions, the imaging properties of the scanner slit may be captured by a set of CD versus defocus data generated for a range of exposure doses. Such data, e.g., the family of Bossung curves, allows predictions of the pattern CDs by recording image defocus and dose.

Figure 1B:
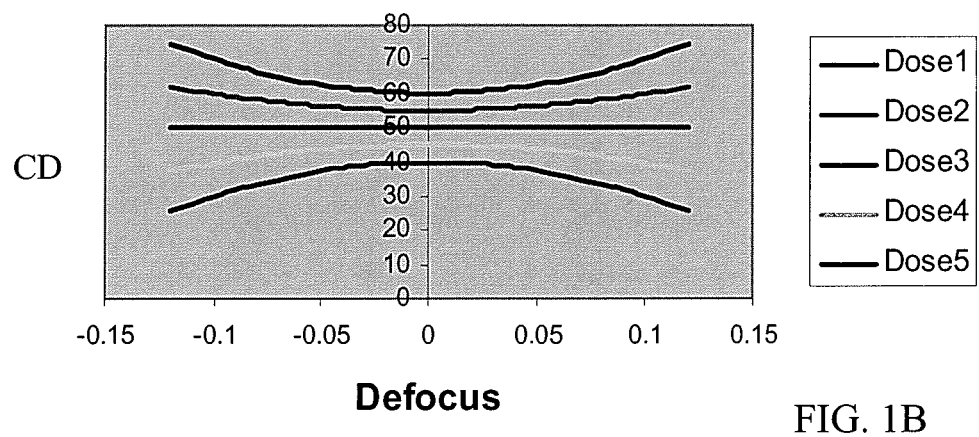
FIGS. 1B and 1C depict relationships between CD, defocus, and dose, in accordance with aspects of the invention.
Figure 1C:
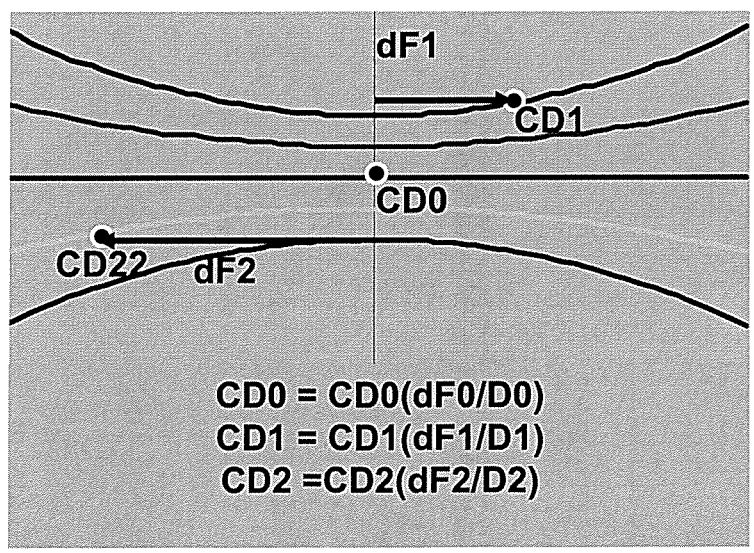

FIGS. 1B and 1C present a set of CD versus defocus data, e.g., a family of Bossung curves, for a particular pattern. In FIG. 1B, the defocus value is given at the x-axis, the CD value is given at the y-axis, and each curve corresponds to a different dose level. Thus, FIG. 1B shows pattern CD versus defocus data for a set of doses ranging from Dose1 to Dose5. In this manner, FIG. 1B shows a set of Bossung curves uniquely identifying an imaging system (e.g., scanner). FIG. 1C is a magnification of a portion of FIG. 1B. The data set thus uniquely links any pair of defocus and dose (dF/D) with a CD produced by the imaging system represented by the graphs.

Families of Bossung curves, such as those shown in FIGS. 1B and 1C, are pattern-specific in the sense that imaging responses of different patterns are represented by different shapes of curves. The families of Bossung curves are also particular to the scanner being used in that the line shapes in a particular family of Bossung curves uniquely define the setup conditions of the imaging system with which they are associated. The shapes of the curves are determined by a wide range of characteristics such as mask type, pattern and CD, illuminator setup and properties, i.e. illumination layout and polarization, projection lens conditions, i.e. numerical aperture (NA), aberration and apodization, and resist parameters and conditions. Thus, exposure dose and defocus are two drivers of image CD and, for a given imaging setup, the dose and defocus determine image CD at any location in the image field.

FIGS. 1B and 1C illustrate that for any pair of defocus and dose (dF/D) there is a unique CD value. As the result, the CD values can be uniquely predicted from dF/D pairs by mapping them on the family of Bossung curves. Additionally, interpolation in defocus and dose domains may be used to approximate a CD in situations when a dF/D pair is not captured by the family of Bossung curves.

Figure 2:
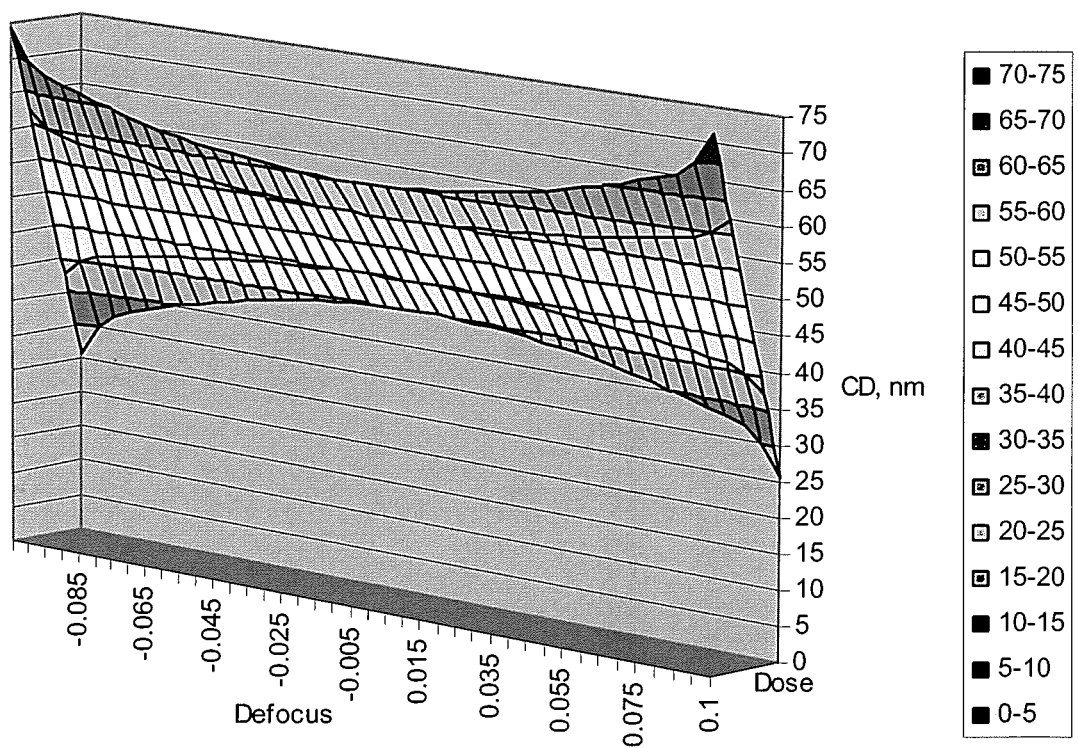
FIG. 2 shows an alternative representation of a relationship between CD, defocus, and dose, in accordance with aspects of the invention.

FIG. 2 shows an alternative way of representing properties of an imaging system. In particular, FIG. 2 shows a 2D map of pattern CD versus defocus and dose constructed from the Bossung curves shown in FIGS. 1B and 1C (FIGS. 1B, 1C and 2 capture the imaging properties of the same system). A map, such as that shown in FIG. 2, interpolates CDs for the defocus and dose combination not included in the domain of the original Bossung curves, e.g., as shown in FIGS. 1B and 1C. In this manner, the map provides a way to determine any CD within the range of defocus and dose of the Bossung curve families. For example, to determine the CD values for any combination of defocus and dose, it is sufficient to project a point (dFi, Di) on the CD surface. The projection of the (dFi, Di) on this surface is a CDi value predicted for the imaging systems captured by the family of the Bossung curves from FIGS. 1B and 1C.

The families of Bossung curves may be determined in various ways, including via wafer exposure and metrology, scanner signature, and a combination of scanner signature and wafer exposure and metrology, which are described in greater detail herein. The wafer exposure and metrology method involves performing plural exposures at different focus and dose to create a Focus/Exposure (F/E) array, measuring the CDs (e.g., via metrology) at the locations in the F/E array, and combining this data to create the Bossung curves. These Bossung curves are recorded at various locations in the scanner image plane. The scanner signature method involves predicting the Bossung curves using imaging simulations based on known scanner imaging attributes. The scanner signature approach relies on completeness of the imaging model used for the simulations, e.g., details of the illuminator, mask, and projection lens at various locations of the scanner image plane, are predetermined before the imaging model is constructed. Both methods of constructing the families of the Bossung curves, e.g., the wafer exposure and metrology method and the scanner signature method, provide an imaging model representative of the imaging conditions at the image location for which the Bossung curves are generated.

Scanner Imaging

As described above, the imaging properties of a scanner at any location in the image plane can be represented by family of Bossung curves. In accordance with aspects of the invention, this approach is extended to represent imaging properties of the entire scanner slit and field, which, in turn, is extended to representing image formation across the entire wafer.

Imaging conditions may differ at various locations in the scanner slit. These differences may be due to variations in imaging conditions such as mask pattern and mask CD variation, illumination layout and polarization variations, projection lens NA, aberration and apodization variations, scanner flare, and localized resist responses that are induced by the resist process. Implementations of the invention represent imaging properties of the scanner slit by recording several families of Bossung curves, e.g., one family of Bossung curves for each location in the slit where scanner imaging is to be monitored.

Figure 3:
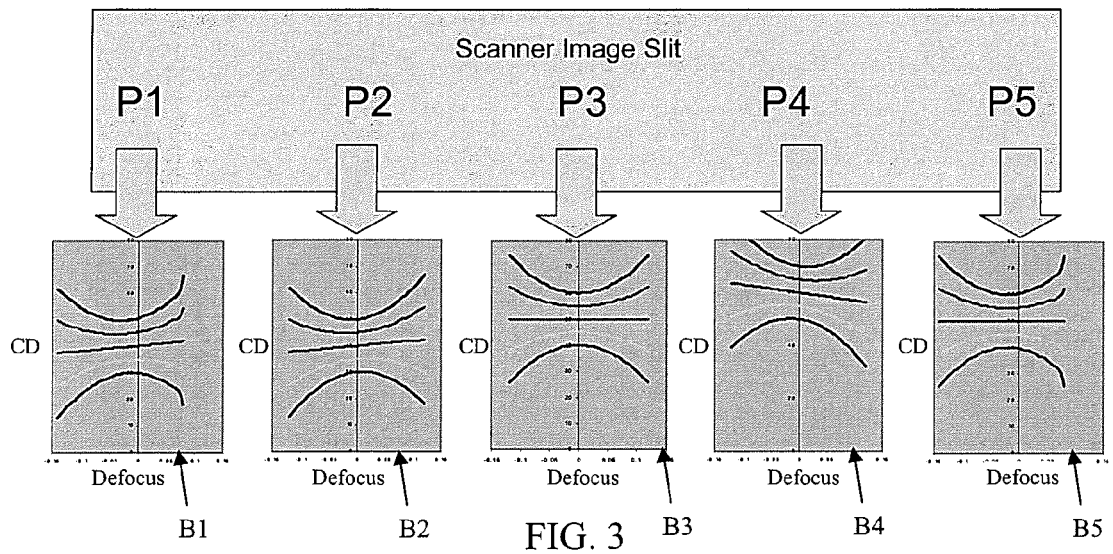
FIG. 3 depicts image formation across a scanner slit captured at a predetermined number of locations in accordance with aspects of the invention.

FIG. 3 depicts image formation across a scanner slit captured at a predetermined number of locations in which each location is represented by a different family of Bossung curves. More specifically, FIG. 3 shows a slit diagram in which five locations P1-P5 are identified. FIG. 3 also shows a set of five families of Bossung curves B1-B5, each capturing the imaging properties of one respective location P1-P5. As shown in FIG. 3, shapes of CD vs. defocus curves in each of the families B1-B5 differ, reflecting the local differences in the image formation conditions present in the scanner slit. Although five slit locations and five corresponding families of curves are shown, the invention is not limited to this number, and any suitable number of locations and families of curves may be used within the scope of the invention.

Due to the actual scanner operation and wafer conditions, various locations in the slit might be at different defocus. The differences in defocus result from the operation of scanner focus control and leveling subsystems, the wafer, wafer stage flatness, wafer topography, and image plane shifts. In addition, various locations in the image slit might receive different exposure doses due to illumination non-uniformity. A defocus and dose pair (dFj/Dj) recorded at each point Pi and referenced to the location family of Bossung curves Bi may be used to uniquely predict pattern CDj at that location Pi. As such, in accordance with aspects of the invention, a pattern CD map across-slit may be determined by: constructing families of Bossung curves Bi for each location Pi, recording dFj/Dj pairs representing image formation at each location, and deriving CDj from the Bossung curves and dFj/Dj pairs.

Figure 4:
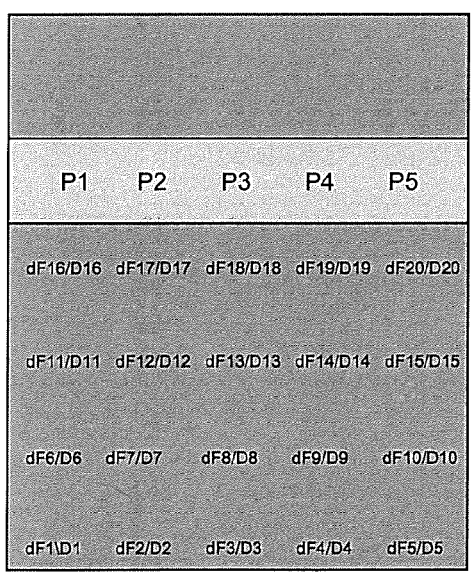
FIG. 4 depicts a scanner field exposure composed of patterns exposed in advancing slit in accordance with aspects of the invention.
Figure 5:
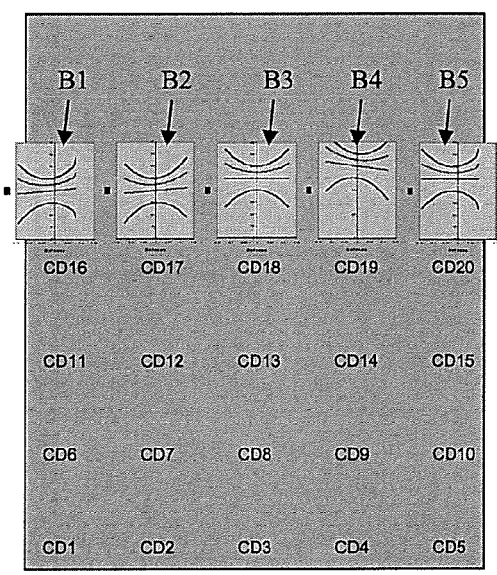
FIG. 5 shows a CD map of a pattern in a scanner field in accordance with aspects of the invention.

For example, FIG. 3 shows respective families of Bossung curves Bi constructed for locations Pi (P1-P5) of a slit. In embodiments, the families of Bossung curves may be determined as described in greater detail herein. FIG. 4 shows dFj/Dj pairs (dF1/D1-dF20/D20) recorded at the locations Pi. In embodiments, the dFj/Dj pairs are determined from scanner operation, e.g., from trace data obtained during exposure runs. FIG. 5 shows CDj values (CD1-CD20) corresponding to each respective dFj/Dj pair using the respective families of Bossung curves constructed for locations Pi of the slit. In embodiments, each respective CDj value is derived from the corresponding dFj/Dj pair and family of Bossung curves Bi.

According to aspects of the invention, FIG. 4 depicts a scanner field exposure composed of patterns exposed in advancing slit. Due to operation of the scanner during full field exposure, the dFj/Dj pairs may change at each location Pi of the slit. For example, during scanner operation, the slit advances through the field while the exposure conditions at each point of the slit change. Specifically, the exposure dose and the image defocus may change from one location to another. As a result, each point in the scanner field may be exposed under different values of defocus and dose, and these respective values are represented in FIG. 4 by the pairs dFj/Dj, and may be referred to as across field imaging.

In accordance with additional aspects of the invention, FIG. 5 shows a CD map of a pattern in the scanner field, the CD map comprising the CD values CDj (CD1-CD20) and being composed of pattern exposures in advancing slit. In embodiments, the defocus and dose pairs dFj/Dj from FIG. 4 are transformed into pattern CDj values using the appropriate family of Bossung curves Bi for the location Pi. In implementations, the set of Bossung curves families, such as those in FIG. 3, are used to transform the dose and defocus values delivered by the scanner subsystems into pattern CDs exposed in the scanner field. This is illustrated by FIG. 5 depicting the relationship between the set of families of Bossung curves representing imaging conditions of various locations in the slit. Accordingly, the set of Bossung curves families may be used to transform dFj/Dj pairs into image critical dimensions CDj for j=1, 2, 3 . . . . During actual scanner operation, the defocus and dose can differ from one location to another resulting in different values amongst the dFj/Dj pairs, and such variation may result in across-slit CD distribution via the set of Bossung curves families.

Figure 6:
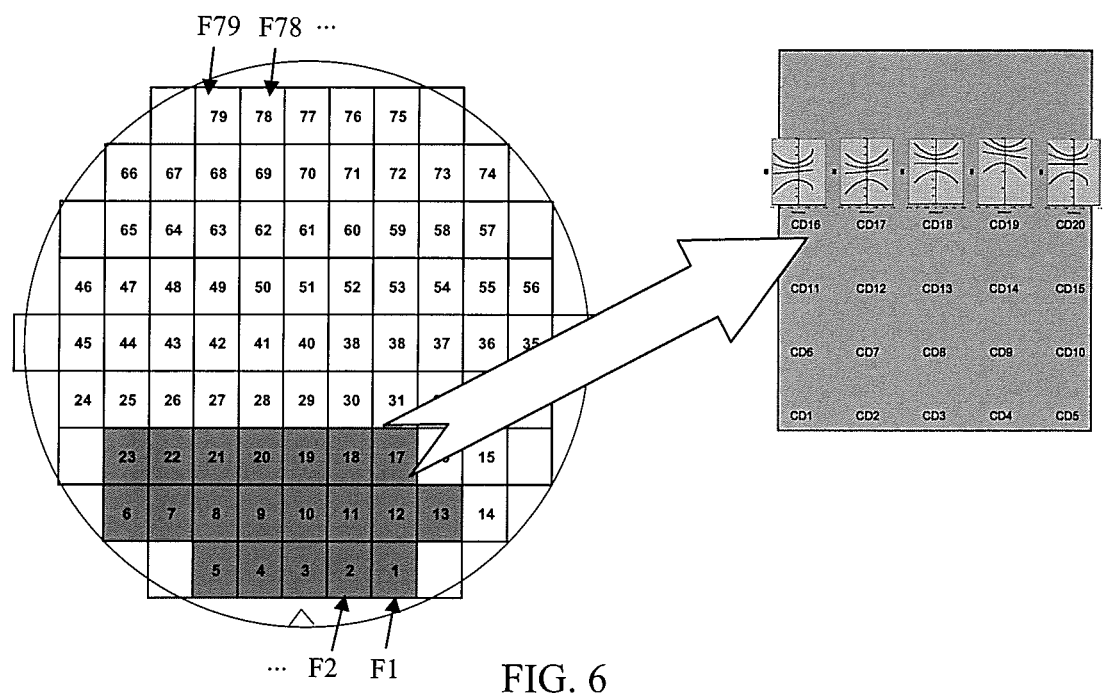
FIG. 6 shows a CD map arranged in a number of fields across a wafer in accordance with aspects of the invention.

During wafer patterning, the process of described in FIG. 4, e.g., across field imaging, is repeated at multiple fields across the wafer. For example, while FIG. 4 shows a single field of a wafer, the wafer may actually comprise a large number of fields Fk (e.g., F1-F79) as shown in FIG. 6. During across wafer imaging, the scanner subsystems deliver various combinations of patterning defocus and dose (e.g., dFj/Dj pairs) for each respective field Fk. The dFj/Dj pairs for each respective field Fk may be used to determine an across-wafer distribution of pattern CDs in the same manner as described above with respect to FIG. 5. The resulting CD map is directly linked to defocus and dose history of the wafer exposure via the set of the Bossung curves families. In particular, the across-wafer pattern CD map shown in FIG. 6 is patterned as a sequence of scanner field CD maps.

Each scanner field patterning on the wafer may comprise a sequence of repeat events subject to location-specific imaging conditions captured by the set of Bossung curves families, and continually changing defocus and dose delivered to various locations on the wafer. These continuous changes of defocus and dose make patterning of each scanner field on the wafer an independent event, recorded in its defocus and dose histories. The image formation conditions at various locations across-wafer may differ due to patterning process conditions independent of the scanner, such as across-wafer variations caused by the resist track. These differences add wafer-process related CD excursions modifying the final across-wafer CD map.

Scanner Imaging Representation

Figure 7A:
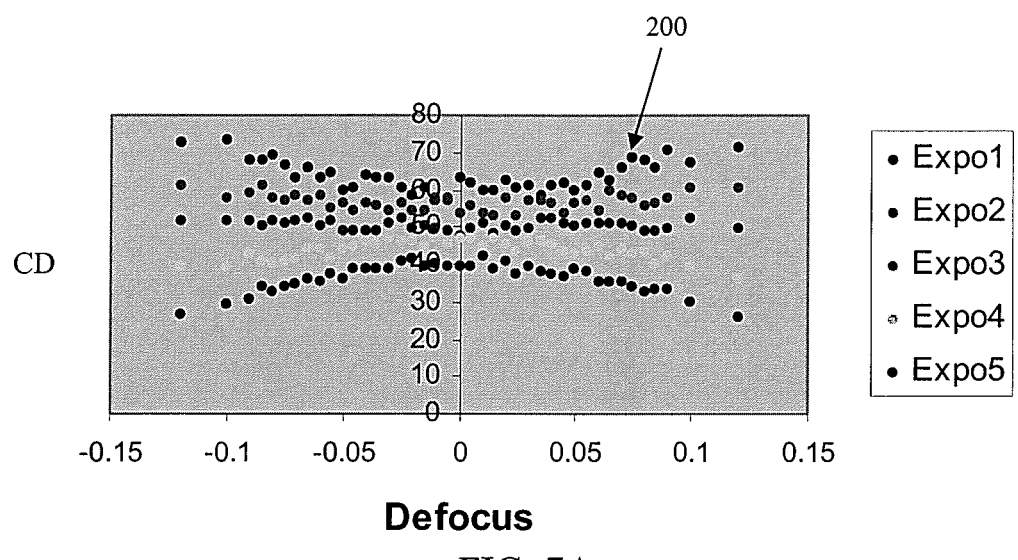
FIGS. 7A, 7B, and 8 depict a method for constructing sets of Bossung curves in accordance with aspects of the invention.
Figure 7B:
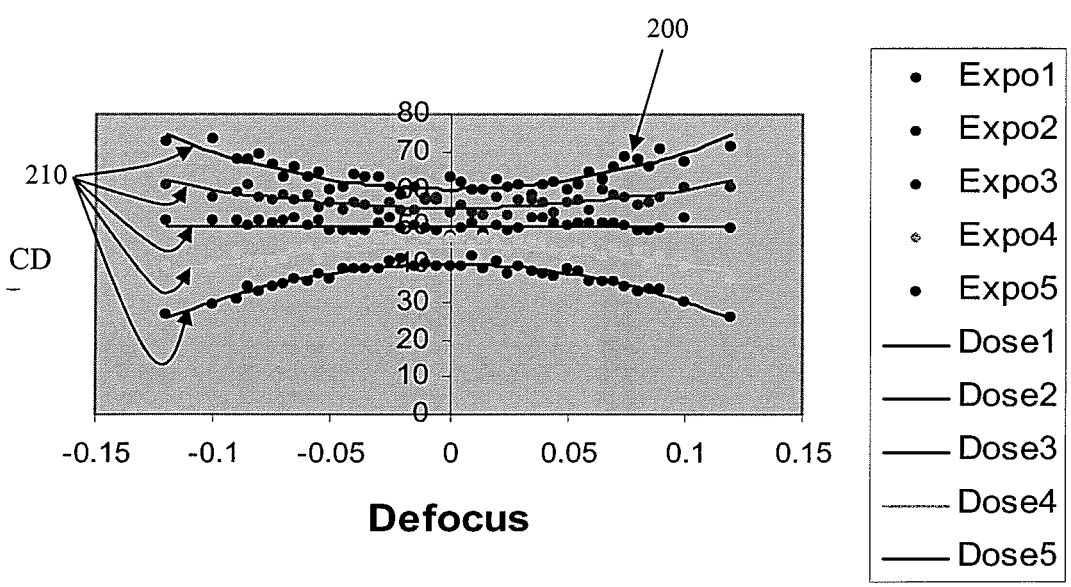
Figure 8:
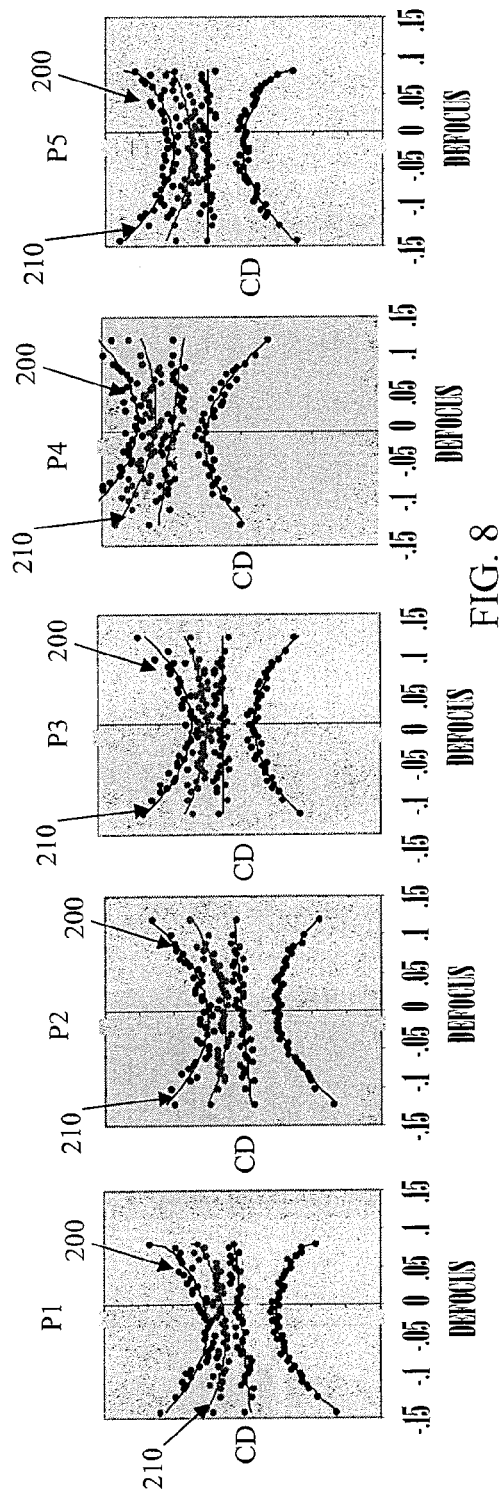

FIGS. 7-10D depict methods of determining relationships between CD, defocus, and dose, e.g., families of Bossung curves, in accordance with aspects of the invention. The processes described in this section may be used to characterize imaging conditions across a scanner slit. In particular, the processes described in this section may be used to generate the set of Bossung curves families characterizing image formation at different locations in the scanner slit. Three methods are presented for determining the Bossung curves, including: 1) based on the pattern exposure and metrology, 2) involving imaging model imbedding scanner signatures, and 3) involving imaging model imbedding scanner, and anchored in pattern exposure and metrology FIGS. 7A, 7B, and 8 depict the wafer exposure and metrology method for constructing sets of Bossung curves. This first method relies on a set of actual pattern exposures on the wafer and subsequent pattern metrology, and subsequently fitting Bossung curves to data obtained from the pattern exposures and metrology. For example, FIG. 7A shows plural data points 200 corresponding to CD values measured using metrology after a set of wafer exposures at recorded defocus and dose. In embodiments, the location of the image in the scanner slit is tracked and the defocus and exposure values are monitored for each pattern. These tests yield the set of data points 200 depicted in FIG. 7A.

After the exposure and metrology data points 200 are collected, a family of Bossung curves is fit to the data. For example, FIG. 7B shows Bossung curves 210 fit to the data points 200, e.g., via numerical methods. The Bossung curves 210 represent the imaging conditions at the slit location at which the wafer exposure and metrology were conducted.

FIGS. 7A and 7B show data points 200 and Bossung curves 210 for a single slit location. In embodiments, however, data points and a set of Bossung curves may be determined for more than one slit location. For example, FIG. 8 depicts wafer exposure and metrology data points 200, and corresponding Bossung curves 210 fit to the data points, for five different slit locations P1-P5. In particular, FIG. 8 shows exposure and metrology data points and curve fit results for five different locations in the scanner slit. The data points 200 at each graph show families of CD vs. defocus data collected from wafer exposures and metrology. The lines 210 on the graphs show Bossung curves fitted to the wafer exposure and metrology results. The set of families of Bossung curves represents the imaging conditions at the five positions P1-P5 across the slit. Though very effective, the wafer exposure and metrology methodology has a disadvantage of requiring a high amount of expensive exposure and metrology resources, in terms of both equipment and manpower. This disadvantage is compounded by the fact that the wafer exposure and metrology data is generated anew for each pattern of interest.

Figure 9:
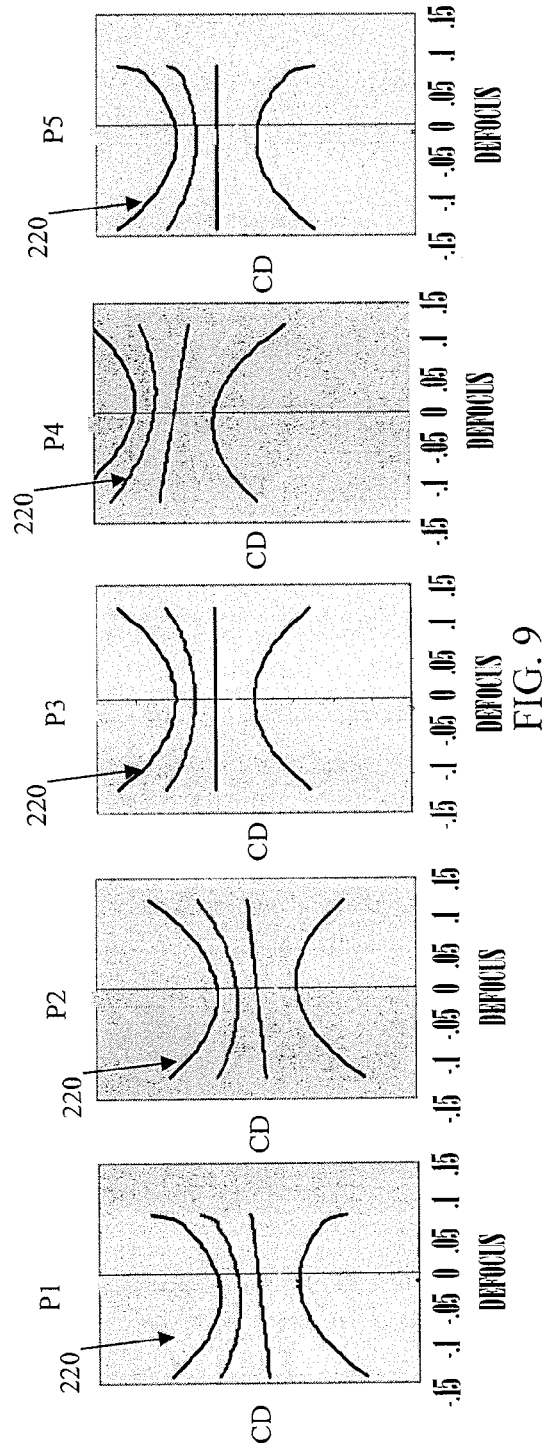
FIG. 9 depicts a method for constructing sets of Bossung curves in accordance with aspects of the invention.

FIG. 9 depicts a second method for constructing sets of Bossung curves in accordance with aspects of the invention, i.e., the scanner signature method. In the scanner signature method, the Bossung curves are determined through modeling of the scanner using predetermined imaging attributes of the scanner. For example, when the imaging attributes for a scanner are completely characterized, i.e., all of the scanner subsystems contributing to image formation are tested and quantified, the family of Bossung curves may be predicted by an imaging model imbedding the scanner attributes, e.g., scanner signatures. To construct the set of families of Bossung curves capturing imaging properties of multiple locations in the slit, the scanner attributes specific to these locations are recorded. When this is done, the scanner slit imaging can be represented by the data set such as the one shown in FIG. 9.

In particular, FIG. 9 shows sets of Bossung curves 220 that are predicted by a scanner imaging model using attributes of the scanner at different slit locations P1-P5. Once the imaging attributes of the scanner are recorded, this method of characterizing the imaging in the scanner slit is very efficient, and can be applied for a wide range of patterns. To properly capture the impact of wafer process on the imaging, the model setup requires some metrology anchor. The anchor is accomplished by exposures and metrology tests for particular setup patterns, and fitting some of the model adjustable parameters to best match the modeling results with the corresponding metrology results.

A third methodology for constructing a set of Bossung curves is illustrated in FIGS. 10A-10D and involves a combination of the wafer exposure and metrology method and the scanner signature method. This third method combines the efficiency of scanner signature method with a limited anchor done specifically for the pattern of interest. This pattern specificity differentiates it from general scanner signature based method, and captures the imaging response of the pattern of interest. In embodiments, this third method of constructing the set of families of Bossung curves representing imaging properties of multiple locations in the slit comprises four steps as depicted in FIGS. 10A-10D.

Figure 10A:
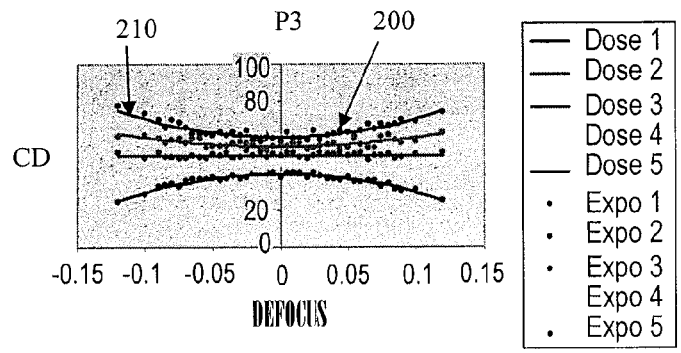
FIGS. 10A-10D depict a method for constructing sets of Bossung curves in accordance with aspects of the invention.

Step 1 is depicted in FIG. 10A and comprises wafer exposure, metrology, and curve fitting for one location of the scanner slit, e.g., in the manner described above in FIGS. 7A and 7B. In embodiments, Step 1 involves imaging the patterns of interest in one location of the slit, e.g., the slit center (P3). The exposures are performed to capture a pattern CD as a function of defocus at multiple exposure (dose) levels. The patterns are processed and CD metrology is conducted. The resulting focus exposure data points 200 are fitted to a family of Bossung curves 210. This family is imaging reference representing slit center.

Figure 10B:
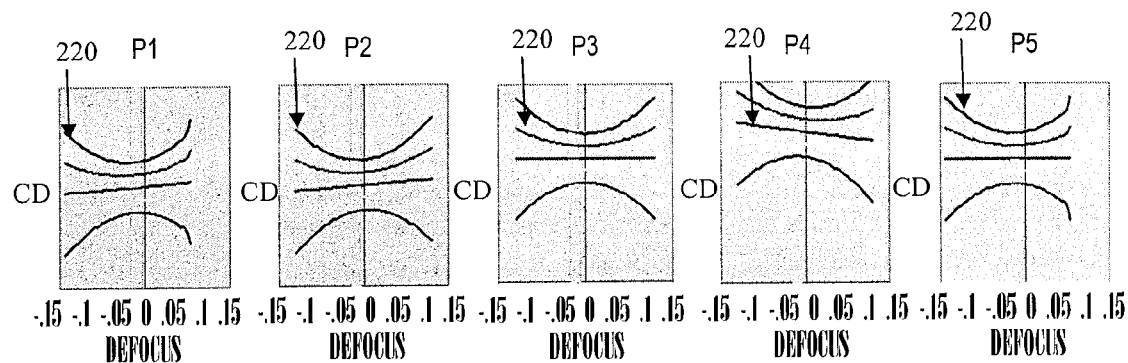

Step 2 is depicted in FIG. 10B and comprises generating scanner signature based slit response. In embodiments, Step 2 involves setting up imaging models imbedding scanner signatures for multiple locations in the slit, including the reference location where the pattern exposure and metrology in Step 1 were performed. These models are then used to simulate sets of Bossung curves 220 at the other slit locations P1, P2, P4, and P5, each capturing the imaging properties of the location for which the scanner signature is imbedded in one of the models.

In accordance with aspects of the invention, the simulated Bossung curves 220 for the reference location P3 are linked with the Bossung curves 210 constructed in Step 1. This may be accomplished by aligning the model dose values with metrology values in such a way that the two Bossung families are aligned. Once the dose scales are aligned, the remaining families of location-specific Bossung curves are calculated for the dose values set.

Figure 10C:
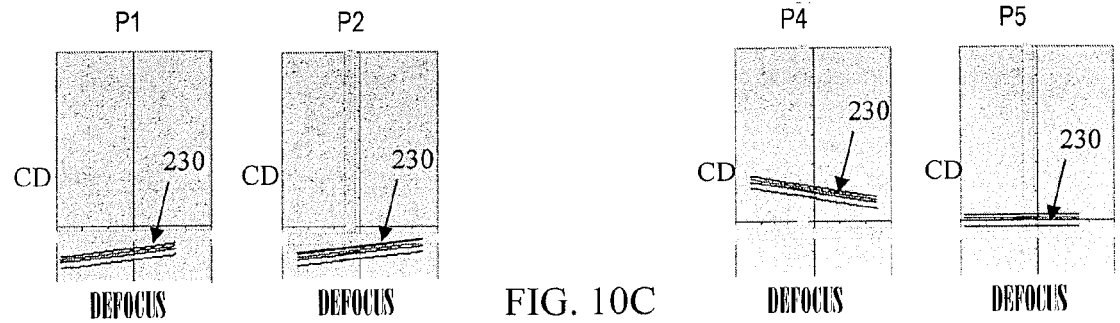

Step 3 is depicted in FIG. 10C and comprises extracting across-slit response excursions 230. In embodiments, Step 3 comprises calculating a set of location-specific excursions of the Bossung curves. These excursions are in dCD vs. defocus format for the dose set established in Steps 1 and 2, where dCD is the difference between the location-specific, simulated CD and a corresponding modeled CD in the reference location, e.g. the scanner slit center P3

Figure 10D:
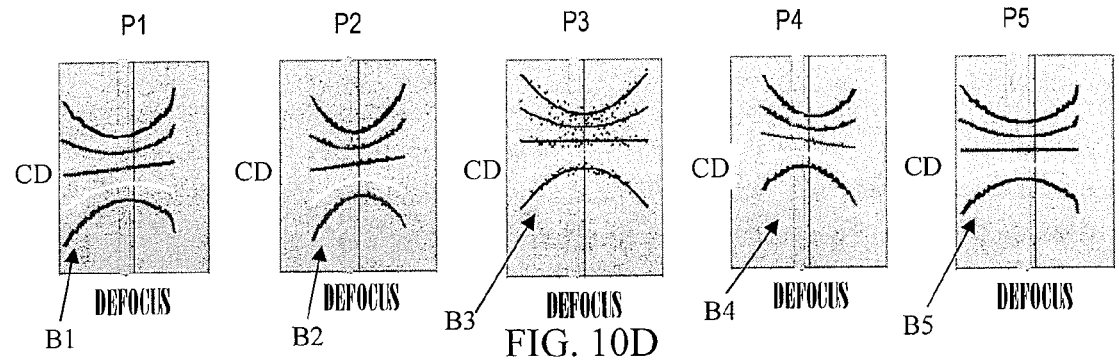

Step 4 is depicted in FIG. 10D and comprises combining metrology and slit response excursions. In embodiments, Step 4 comprises calculating the set of families of Bossung curves. For the locations other than the reference location, e.g., slit center, this is done by adding location-specific dCD's calculated in Step 3 to the family of reference Bossung curves fitted to the data collected in Step 1. These sums of location-specific excursions and the reference Bossung families represent imaging responses of various locations in the slit. It is supplemented by Bossung family fitted in Step 1 forming a complete set of Bossung curves families for the slit, combining the metrology anchor and scanner signature-based imaging models predictions.

According to other aspects of the invention, an alternative to Bossung curve method is interpolation among the metrology data points. In this method, the fit of Bossung curves to the metrology data is not performed. Instead, in embodiments, the imaging response of a scanner is recorder as a discreet set of CD responses to a discrete set of dose and defocus pairs. This approach allows one to find the CD at any given dose and defocus pair by interpolating the CD among the imaging responses at the discrete dose and defocus pairs. This interpolation method applies to metrology and scanner signature methods of constructing the scanner imaging model in accordance with aspects of the invention.

Scanner Variations and Drifts

This section describes changes in the imaging properties of the scanner caused by instantaneous fluctuations and evolutionary drifts of the scanner subsystems. Techniques for accounting for these variations in accordance with aspects of the invention are also disclosed.

Under normal operating conditions, the set of the Bossung curves families representing imaging condition at various points in the slit is substantially constant. However, two aspects of scanner operations may cause changes in the imaging properties of the scanner. These aspects are referred to instantaneous variations and evolutionary drifts.

Instantaneous variations are minute, instantaneous variations of the scanner conditions caused by the dynamics of the wafer exposure. Scanner dynamic operation results in a range of fast fluctuations around the nominal imaging conditions. These fluctuations occur in level of exposure, scan synchronization, image locations and are compounded by image plane tilt and resist effects such as diffusion of the molecules driving the photochemistry of resist exposure. All of these impacts lead to instantaneous and minute changes in the image contrast and, therefore result in CD excursions. The scale of these excursions is small as compared to primary components of imaging system, i.e., imaging dose and defocus.

This range of engineering, physic and chemistry phenomena is difficult to account for on the basis of first principle. Instead, phenomenological treatment is more effective. Some of these excursions can be represented as instantaneous dose and defocus variations. As such, in embodiments of the invention, these instantaneous variations are accounted for by convolving the CD estimates for the imaging systems at the defocus and dose values nominal for a given imaging event, with the defocus and dose distributions representing dynamics of the exposure process. In embodiments, this image correction is represented by formula 1:

$$CDi_{dyn}(dFi,Di) = \iint CDi_{nom}(dFi-f, Di-e) p(f) p(e) df de \quad (1)$$

In formula 1, $CDi_{dyn}(dFi, Di)$ is CD corrected for dynamic operation of the scanner pattering at the nominal dFi/Di conditions. $CDi_{nom}(dFi, Di)$ is the nominal CD, i.e. the value of image CD not impacted by the dynamics of scanner operation, p(f) and p(e) are the distributions of defocus and dose around the nominal conditions. p(e) is estimated from trace of the dose irradiance delivered to the wafer. p(f) is estimated from the focus monitor traces, image plane tilt in the scan direction, and diffusion coefficients of the resist molecules. In embodiments, the double integration in formula 1 is performed over the ranges of defocus and exposure dose variations representative of the scanner operations, i.e. the ranges determined by the scanner operation.

Evolutionary drifts are changes of the scanner subsystems during their operational lifetime. During the scanner life, its imaging properties continually change, albeit such changes are typically very slow and very minute. In particular, changes in one or more of the illuminator, projection lens, and scanner alignment may lead to changes in the imaging properties of the scanner. These changes manifest themselves, for example, as changes in illuminator pupil fill and its uniformity across slit, changes in effective NA of the projection lens, changes in projection lens aberration residue, changes in pupil telecentricity, etc. In embodiments of the invention, the impact of imaging properties changes on CD maps is captured through the set of Bossung curves families representing imaging properties of the scanner. In implementations of the invention, these changes are accounted for by periodically repeating the processes for constructing the set of Bossung curves families, e.g., as described with respect to FIGS. 7-10D.

Scanner Defocus and Dose Control

This section describes various contributors to defocus and dose control during scanner operation, including methods for constructs the image defocus and dose maps across scanner slit, across-field, and across-wafer in accordance with aspects of the invention. Various scanner functions determining distribution of defocus and dose variations during the image formation are described, as links between various scanner functions, defocus, and dose accuracies. This section also describes which aspects of dose and defocus control result in systematic or statistical contributions.

Furthermore, this section describes: (1) signals generated by the scanner subsystems that carry the information on the exposure defocus; (2) aspects of scanner operation that impact the accuracy of focus control; (3) signals generated by the scanner subsystems that carry the information on the exposure dose; and (4) aspects of scanner operation that impact the accuracy of dose control. When predicting a CD map in accordance with aspects of the invention, items (1) and (3) are used to identify direct inputs to predict the CDs, and items (2) and (4) lead to estimates of the CD prediction accuracy resulting from the operation of various scanner subsystems.

The data and impacts are described in this section as either static or dynamic. As used herein, static means the data and/or impact does not vary during the exposure across scanner field and across-wafer, while dynamic means the data and/or impact can vary during the exposure. In embodiments, the static data is recorded prior to the actual exposure, and the dynamic traces are monitored continuously during the exposure. This section, however, does not describe two other functions enhancing focus control performance: Iterative Learning Correction (ILC) and Scanner Enhanced Focus Function (SEFF). ILC is not addressed because it enhances scanner ability to minimize the image defocus, and as such, it does not provide the actual values image defocus or defocus accuracy. SEFF is not addressed because it enhances the performance of Auto Focus (AF) system but it does not provide information on the actual AF performance.

Three issues underlying imaging defocus control include: location of the image plane determined by the projection lens; location of the wafer relative to the physical location of the projection lens; and various corrections (e.g., DIMG—setup offsets to match a target performance and DCRS—reticle bow during scan, AMEN—corrections dependent on the direction of the scan) applied to wafer z-position to correct for reticle z-movement. These three defocus corrections are independent of each other and are tracked separately.

The determination of the lens image plane is made through the aerial image sensor (AIS) and Wafer Table Direct Interferometer (WTD). The AIS senses the location of the lens focus while WTD calibrates the distance of that focus from the physical location of the lens. Together, they provide the location and the scale of z-position of the image plane relative to the physical location of the projection lens. This data is static. WTD setup affects focus and leveling performance across the wafer. Poor or improper WTD setup results in focus and tilt errors, i.e., WTD error contributes to dynamic focus errors. In embodiments, the WTD interferometer information is monitored during exposure.

The distribution of image plane position across the slit is represented by the field curvature recorded during Contrast Focus (CF), AIS tests, or PSFM tests. This data measures the focus position results for the focal plane variations across scanner slit. This data is a static.

Auto Focus (AF) traces are collected for a number of locations (e.g., five locations) across slit just prior to the actual exposure. These AF traces are used to form z-position targets for the wafer during the exposure by the wafer z-position control system. The actual z-position of the wafer, relative to the physical position of the lens, is monitored during the exposure by WTD continuously probing how close the position targets are met by the wafer z-position system. In this sense, these WTD traces are dynamic.

The AF sensor offsets are calibrated by ASOC sensor. This data contains the information on offsets of the wafer positions targets relative to the AF sensor positions. This information is specific to the location in the scanner slit. The ASOC data is static.

Another impact to the defocus is due to DIMG and DCRS functions for correcting reticle z-displacement during the scan. These functions correct for the reticle z-movement by adjusting wafer z-position during the scan. DIMG drives the wafer position correction based on the prior exposure data. Reticle DCRS drives DIMG corrections specific to the reticle. AMEN wafer corrections are based on the direction of the scan. In embodiments, DIMG, AMEN and Linear Tilt errors are evaluated and corrected if needed. Sometimes the DIMG and AMEN errors are so small that no corrections are actually applied. DCRS can correct for the Z shape of specific reticles. These errors are typically not very large, but if ignored could contribute focus error. If any of these corrections are not applied, they need not be accounted for during image defocus analysis.

The composite of image plane distribution across-slit and the WTD traces, and when applicable, the image plane corrections provide the basis for nominal defocus maps across-slit, across-field and across-wafer. This composite is dynamic.

The position of the wafer relative to lens image plane during exposure of the images in the scanner is monitored by WTD sensor (wafer table direct interferometer). During the pattern exposure a scanner may be subject to defocus variations during exposure. Fluctuations of the WTD traces showing the wafer position relative to the image plane along the scan direction, provide a basis for defocus variation distribution and range estimates across-slit, across-field and across-wafer. This composite is dynamic. In embodiments, this defocus distribution may be modified to account for the dynamics of the resist molecules participating in exposure process photochemistry. These resist related factors determining p(f), the defocus distribution around the nominal, described above in formula (1).

Defocus accuracy may be affected by a number of scanner functions. For example, ASOC calibration accuracy determines how accurately the AF sets the wafer z-position targets, which is a static impact.

Aerial Image Sensor (AIS) accuracy and repeatability determines how accurate AF signals were calibrated to identify the lens image plane. This accuracy is impacted by the AIS fiducially degradation. This is a static impact.

Accuracy and repeatability of AIS calibration determines accuracy of lens best focus measurement. This is a static impact.

Infrared Aberration Control (IAC) determines how accurately lens focus is corrected to account for dipole illuminator induced astigmatism. This is a dynamic impact.

Lens Heat Controller (LHC) determines how accurately the image plane is corrected for the lens thermal loads. This is a dynamic impact.

WTD accuracy of calibrating the z-translation of the wafer may be a static or a dynamic impact.

Scan Synchronization z-MSD determines how accurately the wafer z-position is held during the exposure. This is a dynamic impact.

Two issues underlying dose control include across slit dose distribution and across field dose control. Both of these issue impact dose delivery in the scanner field and across wafer.

Illumination uniformity across slit traces distribution of dose at various locations in the slit. Illumination uniformity data is available from a slit uniformity test. This is a static impact. When dose fluctuates during the scanner operation, e.g. during field exposures across wafer, the illumination uniformity does not change.

Dose delivered to the reticle is monitored by the dose integrator. The dose integrator output signal is a direct trace of the exposure dose. This is a dynamic impact.

Nominal dose distribution across field and image is a composite of uniformity trace along the slit and integrator trace along the scan direction. This is a dynamic impact.

A scanner may also experience dose fluctuations not captured by the dose integrator during exposure. In embodiments, the exposure irradiance integrator trace along the scan direction provides the basis for dose variation distribution and range estimates across-slit, across-field and across-wafer. This is a dynamic impact. These factors determine p(e), the dose distribution around the nominal, in formula (1).

Dose accuracy is impacted by a number of scanner characteristics. For example, dose accuracy may be impacted by the accuracy of integrator calibration with Molectron wafer. This is a static impact.

The dose controller accuracy may also be dependent on scan speed, ND filters, pulse energy stability, slit width etc. This is a dynamic impact.

The dose accuracy may also be impacted by the accuracy of a New Predictive Dose Controller, correcting transient effects in the lens transmission. This is a transient therefore a dynamic impact.

Block and Flow Diagrams

Figure 11A:
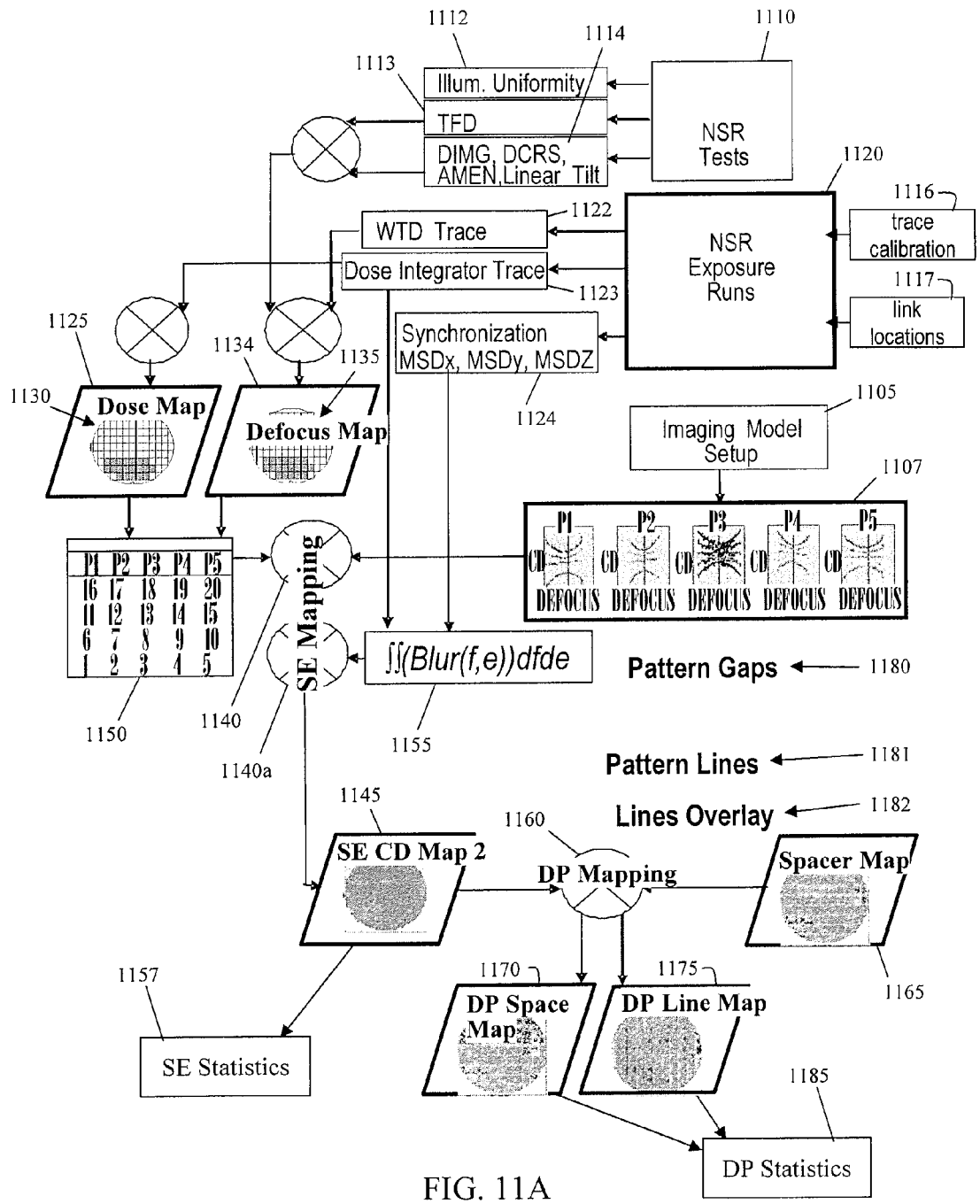
FIGS. 11A and 12 show block diagrams depicting processes in accordance with aspects of the invention.
Figure 12:
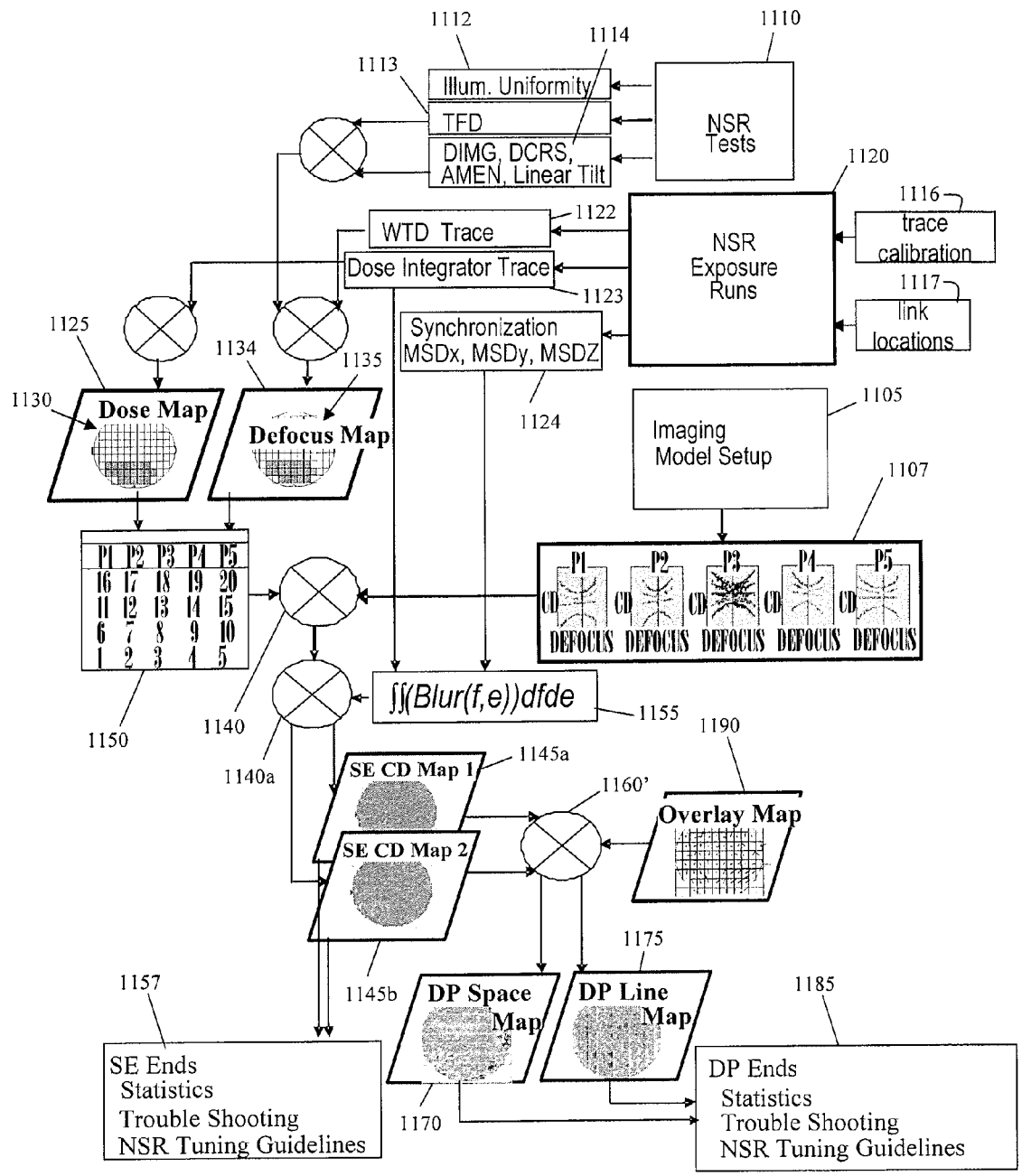

FIGS. 11A and 12 depict block diagrams illustrating processes for constructing a Single Exposure (SE) CD Map and a Double Patterning (DP) Space Map and Line Map in accordance with aspects of the invention. The steps of FIGS. 11A and 12 may be implemented in the environment of FIG. 1, and may be performed using techniques described with respect to FIGS. 2-10.

Referring now to FIG. 11A, step 1105 comprises characterizing the imaging response of the scanner. In embodiments, step 1105 includes constructing static field Bossung curves 1107, e.g., as described above with respect to FIGS. 7-10.

Step 1110 comprises conducting test runs of the scanner to gather data to determine characteristics of the scanner. In embodiments, this data includes: illumination uniformity data 1112 representing does distribution across the slit; total field deviation (TFD) data 1113 detected by AIS and calibrated by WTD; and focus correction data 1114, including DIMG, DCRS, AMEN, and Linear Tilt correction data.

In embodiments, steps 1105 and 1110 are performed prior to the manufacturing exposure runs for a particular wafer. The data obtained in steps 1105 and 1110 may be stored, e.g., in storage system 30 as shown in FIG. 1, and later accessed for use during in situ determination of CD values for a wafer undergoing manufacturing exposure runs.

Step 1116 comprises accessing and calibrating scanner traces. In embodiments, step 1116 includes a Dose Integrator trace calibration and WTD trace calibration, which may be performed in conventional manners. Step 1117 comprises linking locations across the wafer with locations in the Focus/Dose traces.

Step 1120 comprises performing the exposure runs (e.g., the manufacturing lithographic exposures) on the wafer to expose a pattern in a resist on the wafer. Performing the exposure runs at step 1120 includes collecting the scanner traces, such as the Auto Focus and WTD trace 1122 used for scanner defocus monitoring and the Dose Integrator trace 1123 used for monitoring dose delivered to the reticle. Performing the exposure runs at step 1120 may also include collecting Scan Synchronization data 1124, such as MSDx, MSDy, and MSDz, which may contribute to image blur.

At step 1129, a dose map 1130 is created from the scanner traces, in particular the Dose Integrator trace data 1123. In embodiments, the dose map is a data structure defining respective doses applied at respective locations across the wafer during the exposure runs.

At step 1134, a defocus map 1135 is created from the scanner traces and test data, in particular the Auto Focus and WTD trace data 1122, TFD data 1113, and focus correction data 1114. Creating the defocus map is described in greater detail herein with respect to FIGS. 14-26.

At step 1140, an SE CD map 1145 is created using the dose map, defocus map, and Bossung curves 1107. In embodiments, the SE CD map 1145 comprises a data structure that defines a plurality of predicted CD values at locations across the wafer. The predicted CD values may be determined in the manner described above with respect to FIGS. 3-6. For example, the dose map 1130 and defocus map 1135 may be used to define at least one array 1150 of defocus and dose pairs, e.g., dF/D, corresponding to locations on the wafer and positions of the scanner slit. Each dF/D pair in the array 1150 may be used in conjunction with the appropriate Bossung curves 1107 to determine a CD value for a location on the wafer, resulting in an array of determined CD values in which each CD value is linked to a location on the wafer, e.g., the SE CD map 1145.

In embodiments, the SE CD map 1145 may be corrected to account for known resist track impacts resulting in CD modifications across wafer. Such a corrected map would represent the combined impact of scanner and resist track on AWCDU, and may be used in implementations of the invention when determining CD values.

Step 1140 may optionally include step 1140a, which comprises correcting the predicted CD values for the impact of defocus and dose blur. Step 1140a may include, for example, applying a blur function 1155 when determining the CD values, the blur function 1155 being based on at least one of Dose Integrator data 1123 and Scan Synchronization data 1124.

In accordance with aspects of the invention, the SE CD Map 1145 is an AWCDU map and can be used in single exposure (SE) processes to extract SE pattern statistics, e.g., at step 1157. The SE CD Map 1145 and pattern statistics may be used for at least one of scanner monitoring, tuning, and troubleshooting.

In implementations utilizing double patterning (DP), step 1160 comprises using the SE CD Map 1145 and a Spacer Map 1165 to construct a DP Space Map 1170 and DP Line Map 1175. In embodiments, the Spacer Map 1165 comprises a data structure that defines how plural exposures are superimposed on the wafer. Step 1160 may comprise performing a CD error analysis of spacer DP errors, such as, for example, pattern gaps 1180, pattern lines 1181, and lines overlay 1182, which are shown in greater detail in FIG. 11B. In embodiments, the DP Space Map 1170 and DP Line Map 1175 comprise data structures defining line and space CD predictions for the pattern exposed in step 1120.

At step 1185, DP space and line statistics are extracted from the DP Space Map 1170 and DP Line Map 1175. As with the SE statistics, the DP statistics may be used for scanner performance predictions (e.g., predicting the scanner contri-bution to space CD and spacer line overlay), scanner performance troubleshooting (e.g., decoupling scanner and spacer process contributions, scanner analysis across-slit, across-field, across-wafer, etc.), and scanner performance monitoring (e.g., dose and focus trace analysis is the basis for judgment of the scanner stability and condition).

FIG. 12 depicts a block diagram illustrating another process for constructing SE CD Maps and a DP Space Map and Line Map in accordance with aspects of the invention. FIG. 12 includes steps having the same reference numerals as steps shown in FIG. 11A, and these steps are performed in the same manner. As depicted in FIG. 12, the SE mapping step, e.g., step 1140, results in two SE CD maps, e.g., SE DC Map 1 (1145a) and SE DC Map 1 (1145b). The two SE CD maps 1145a and 1145b comprise predicted CD values, e.g., determined as described herein, for separate single exposure patterning processes.

Still referring to FIG. 12, the DP mapping step, e.g., step 1160', comprises deriving the DP Space Map 1170 and DP Line Map 1175 from the SE CD maps 1145a, 1145b and an Overlay Map 1190. The DP mapping step 1160' in FIG. 12 is performed similar to the DP mapping step 1160 of FIG. 11A, but uses different inputs. In embodiments, the Overlay Map 1190 comprises scanner data defining how the two single exposure processes are superimposed. The Overlay Map 1190 represents raw data from which a Spacer Map, e.g., Spacer Map 1165 of FIG. 11A, may be constructed.

According to aspects of the invention, the dose map 1130 and defocus map 1135 are determined in situ (e.g., during lithographic processing in the scanner) of a particular wafer. In embodiments, the dose map 1130, defocus map 1135, and Bossung curves 1107 are used to predict CD values at locations on the wafer for constructing the SE CD Map 1145, DP Space Map 1170, and DP Line Map 1175, which is also performed in situ. The CD values of the constructed maps can be compared to the CD values in the design specification to determine whether the patterned wafer meets the specification. In this manner, implementations of the invention can be used to predict pattern CD values across the entire wafer while the wafer is undergoing the lithographic exposure runs (e.g., in situ) and without resorting to post-exposure metrology (e.g., ex situ).

Figure 13:
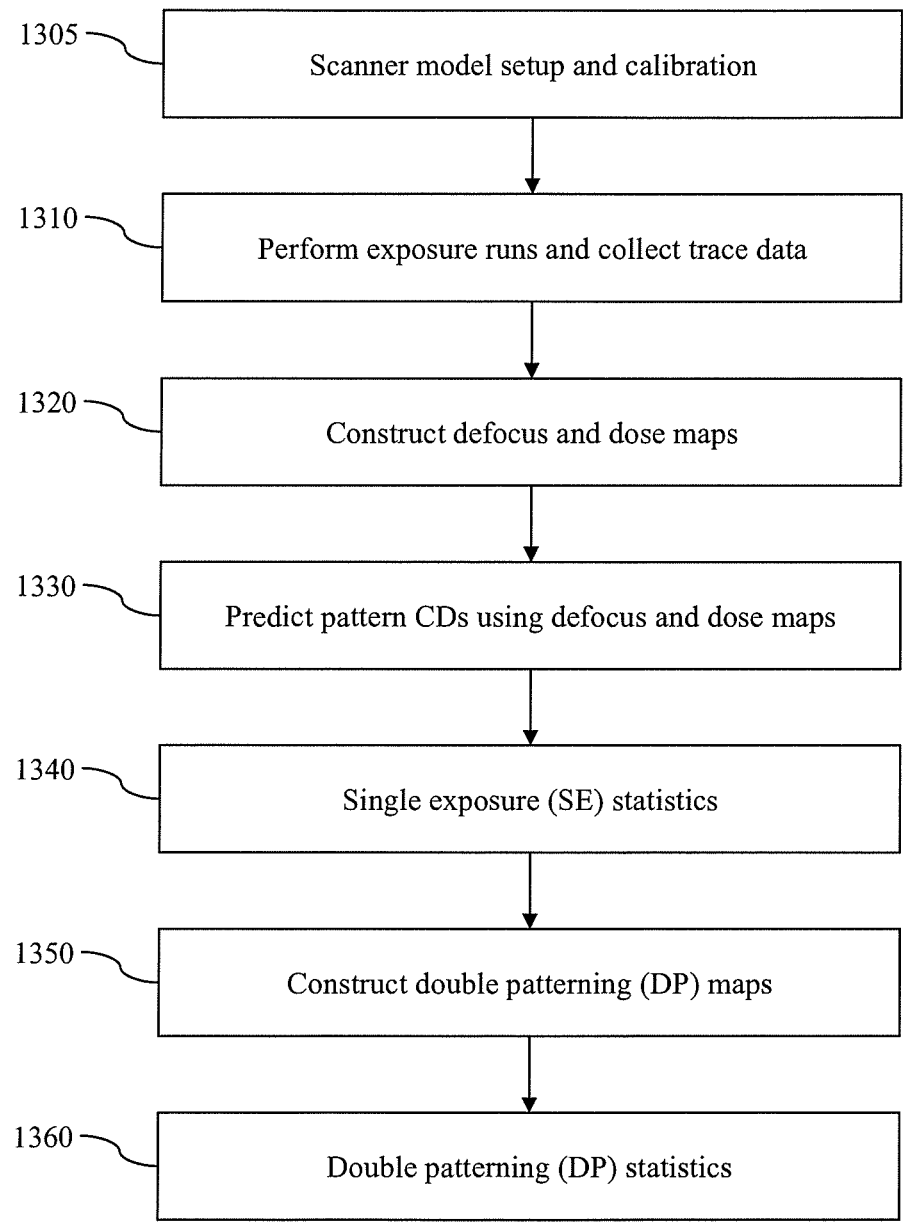
FIG. 13 shows a flowchart of a process in accordance with aspects of the invention.

FIG. 13 depicts a flow diagram illustrating a process in accordance with aspects of the invention. Step 1305 comprises scanner model setup and calibration. In embodiments, step 1305 includes characterizing the imaging response of the system by constructing static field Bossung curves, e.g., as described at step 1105. Step 1305 may additionally comprise accessing and calibrating scanner traces, e.g., as described at step 1116, and linking locations across the wafer with locations in the focus/dose traces, e.g., as described at step 1117.

At step 1310, the lithographic exposures are run and traces are collected, e.g., as described above at step 1120. At step 1320, the defocus and dose maps are constructed from the traces and test data, e.g., as described above with respect to steps 1129 and 1134. At step 1330, the defocus and dose maps are transformed into predicted CD data, e.g., an SE CD Map, using the Bossung curves, e.g., the Bossung curves derived at step 1305 which represent the imaging properties of the scanner for this pattern. Step 1330 may be performed in a manner similar to step 1140, described above, and may optionally include correcting the predicted CD data for blur, e.g., as described at step 1140a. At step 1340, the single exposure pattern statistics are extracted from the SE CD map, e.g., as described with respect to step 1157. The single exposure pattern statistics may be used for at least one of: in situ monitoring the SE patterning process (e.g., comparing predicted pattern CD values to specification CD values), in situ scanner troubleshooting, and in situ scanner tuning.

At step 1350, the SE CD Map and a Spacer Map are used as input for constructing a DP Spacer Map and DP Line Map, e.g., in a manner similar to that described with respect to step 1160 in FIG. 11A. Alternatively, step 1350 may comprise using two SE CD Maps and an Overlay Map to construct the DP Spacer Map and DP Line Map, e.g., in a manner similar to that described with respect to step 1160' in FIG. 12. At step 1360, the DP statistics are extracted from the DP Spacer Map and DP Line Map, e.g., as described with respect to step 1185. As with the single exposure pattern statistics, the DP statistics may be used for at least one of: in situ monitoring of the DP process (e.g., comparing predicted pattern CD values to specification CD values), in situ scanner troubleshooting, and in situ scanner tuning.

Constructing Dose Map and Defocus Map

This section describes data and scanner traces used to construct the dose maps and defocus maps in accordance with aspects of the invention. The trace maps in turn, may be used to create the SE maps representing across wafer maps and distributions, as described herein.

In embodiments, dose maps are created using illumination uniformity data, dose integrator data, and predictive dose controller data. The illumination uniformity data may comprise, for example, data representing dose distribution across the slit. The dose integrator data may comprise, for example, data obtained by monitoring dose delivered to the reticle including Predictive Dose Controller data. In embodiments, the predictive dose controller data may comprise, for example, data correcting transient effects in the lens transmission, data defining how the transient correction is determined and applied to modify the exposure dose target.

According to aspects of the invention, defocus maps are created using at least one of: WTD data, TFD data, focus correction data, autofocus (AF) trace data, AF offset data, reticle sag data and scanner test data. In embodiments, the WTD data is used for scan monitoring and TFD calibration. The WTD data may comprise data defining at least one of: how the WTD accuracy and repeatability are tested; the number and coordinates of points at which WTD traces are recorded; how to map the WTD traces to various points across scanner slit; how the WTD data is referenced to the physical lens position; what the zero of the data set represents, e.g., a physical reference point in the scanner or the lens pupil; how the trace signal scales to the physical distance in z-direction of the scanner; and which points in the trace represents the field leading edge and closing edge.

In embodiments the TFD data is detected by AIS calibrated to WTD. The TFD data may comprise data defining at least one of: a definition by which TFD is measured; how the data is referenced to the physical lens position; what the zero of the data set represents, e.g., a physical reference point in the scanner or the lens pupil; other metrics representing distribution of lens focal plane across the scanner slit.

In embodiments the focus correction data comprises DIMG, DCRS, AMEN, and Linear Tilt data. The focus correction data may further comprise data defining at least one of the following for each of DIMG, DCRS, AMEN, and Linear Tilt data: how the DIMG, DCRS, AMEN, and Linear Tilt data corrections are applied, e.g., as a straight offset to the wafer position or by some other formula; whether the data represents a set of wafer plane adjustments or a data set specifying adjustments at preselected slit points; how these data are indexed to the AF sensors, e.g., whether the corrections are made at the sample points defined by the AF or at some other correction plan; and how the data relates to the physical scale in z-direction of the scanner.

In embodiments the AF trace data comprises data defining AF traces collected at a predetermined number (e.g., five) of locations across the scanner slit just prior to the actual exposure. The AF trace data may comprise, for example, data defining at least one of: which points in the trace represent the field leading edge and closing edge; and how the trace signal scales to the physical distance in z-direction of the scanner.

In embodiments the AF offset data is calibrated by ASOC. The AF offset data may comprise, for example, data defining at least one of: a set of AF calibration offsets or other calibration traces; and how these data are indexed to the AF sensors.

In embodiments the scanner test data comprises data defining at least one of: ASOC, AIS, IAC, LCH, and scan synchronization data (e.g., MSDx, MSDy, and MSDz). The scanner test data may comprise data defining metrics for evaluating accuracy and repeatability of each of the ASOC, AIS, IAC, LCH, and scan synchronization data.

Image Defocus Budget and Map

FIGS. 14-26 depict details of an illustrative method of forming a defocus map in accordance with aspects of the invention. In embodiments, image defocus is the distance from a shot surface to a field curvature, and may be determined as a vector sum of: (i) topography target errors, (ii) stage trajectory errors, and (iii) image plane excursions from the projection optic (PO) focus plane. These aspects of image defocus are described in detail with respect to FIGS. 14-26.

Figure 14:
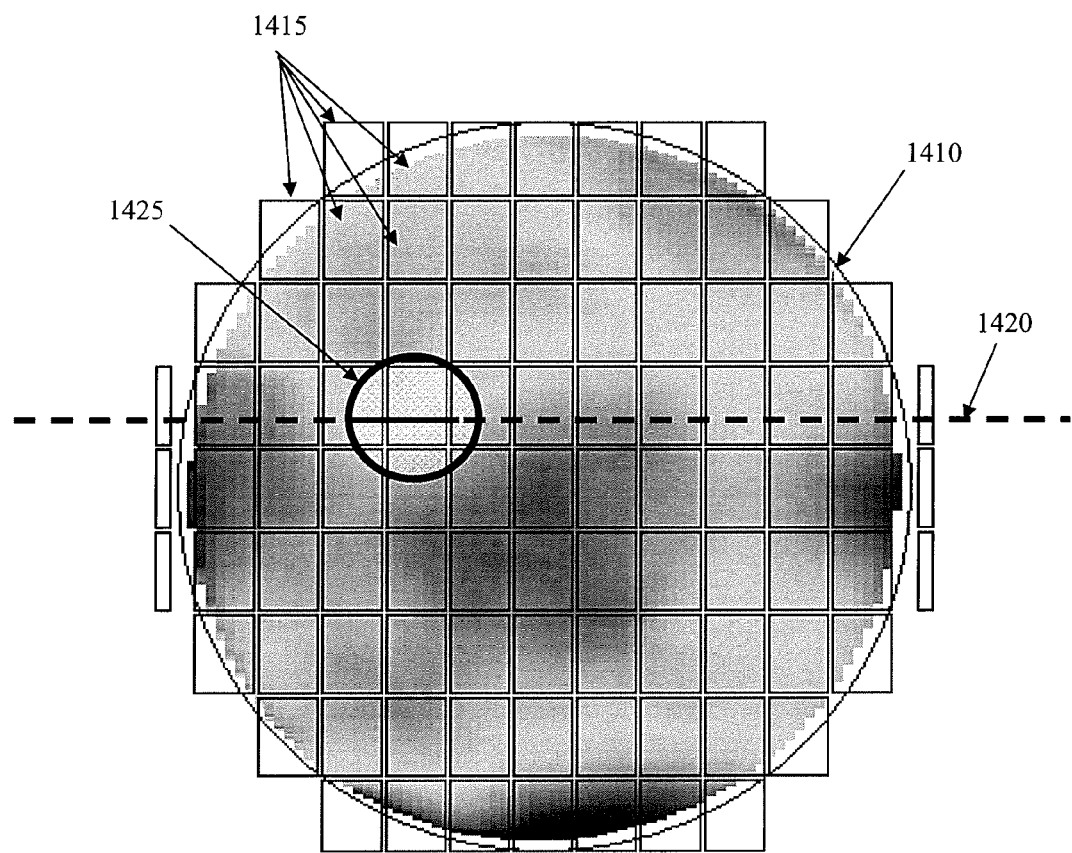
FIGS. 14-26 depict details of an illustrative method of forming a defocus map in accordance with aspects of the invention.
Figure 15:
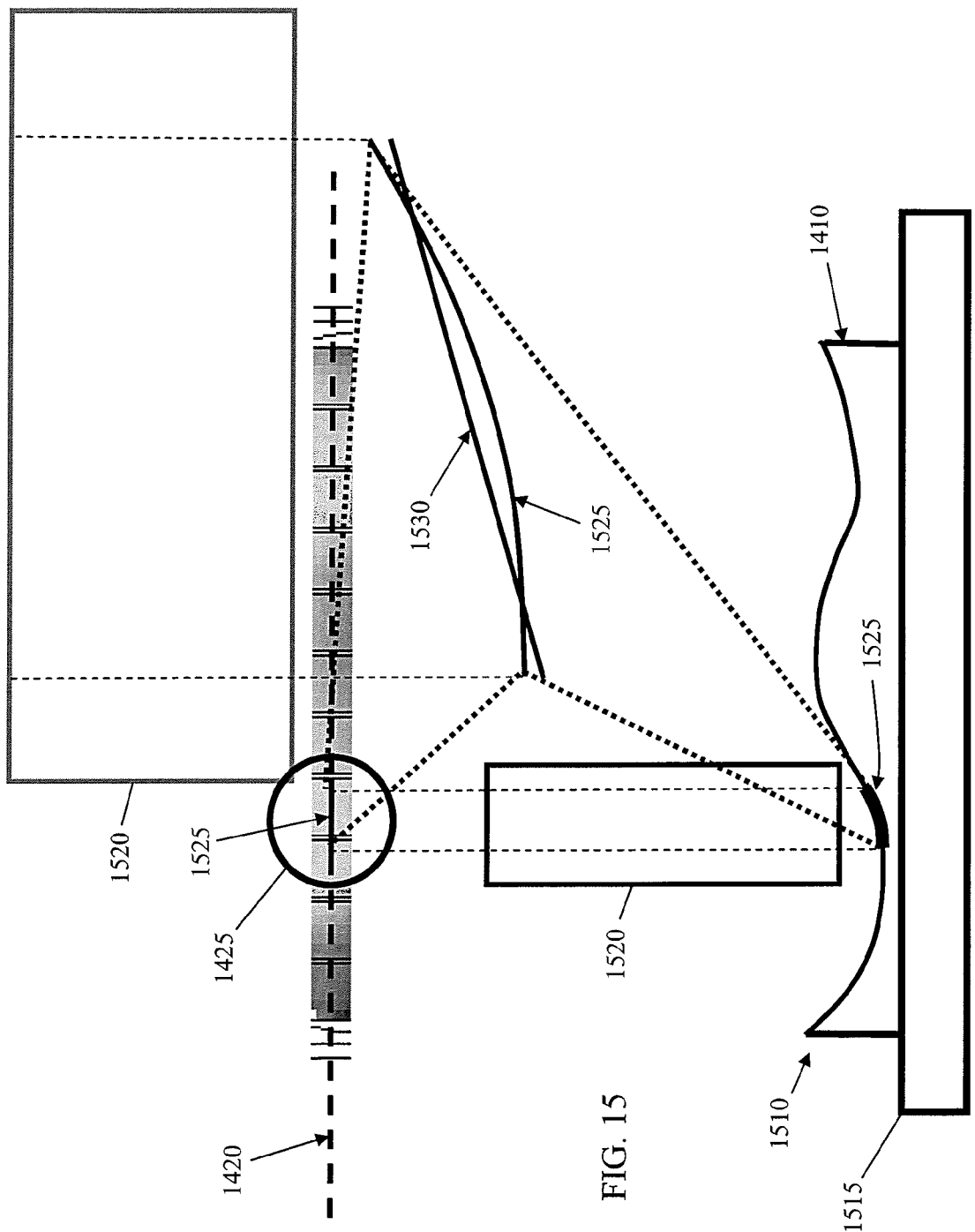

As shown in FIGS. 14 and 15, a wafer surface is not flat. For example, FIG. 14 shows a plan view of a topography of a wafer 1410 in which different shading defines different heights of the wafer upper surface. The wafer topography may be calculated from traces recorded by an autofocus (AF) sensor of the scanner. FIG. 14 shows the wafer 1410 divided into a number of fields 1415. The dotted line 1420 represents a single trace path, and the circle 1425 identifies a particular shot cross section along the path.

FIG. 15 shows a wafer cross section 1510 of the wafer 1410 atop a wafer stage 1515 of the scanner. The wafer cross section 1510 corresponds to a cross section of the wafer along the line 1420 from the top view of FIG. 14, a portion of which is shown for illustration in FIG. 15. Shown above the wafer 1410 a projection optic (PO) 1520 that performs the AF scan. The PO 1520 optically detects a shot surface 1525, which characterizes the topography of a portion of the upper surface of the wafer at the instantaneous exposure position of the PO 1520. Shown enlarged and to the right of the wafer cross section 1510 is a diagrammatic relationship between the shot surface 1525 and a focus target 1530 of the PO 1520. In embodiments, the scanner determines the focus target 1530 as a single straight line based on the spatial orientation of the shot surface 1525.

Figure 16:
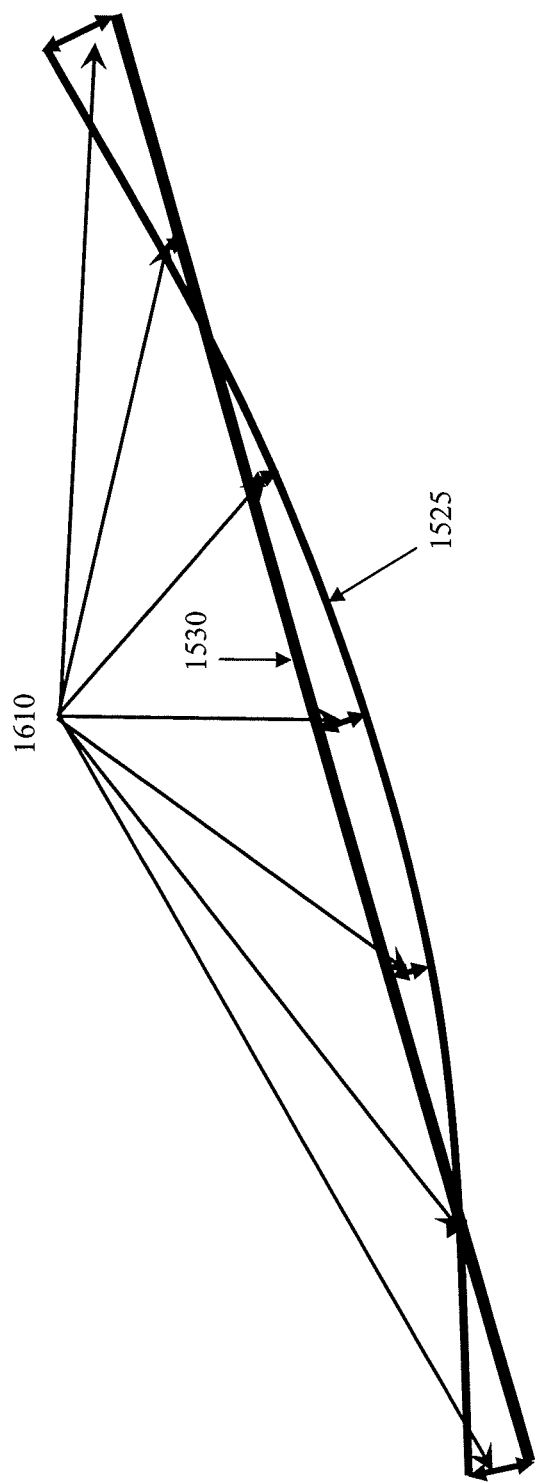
Figure 17:
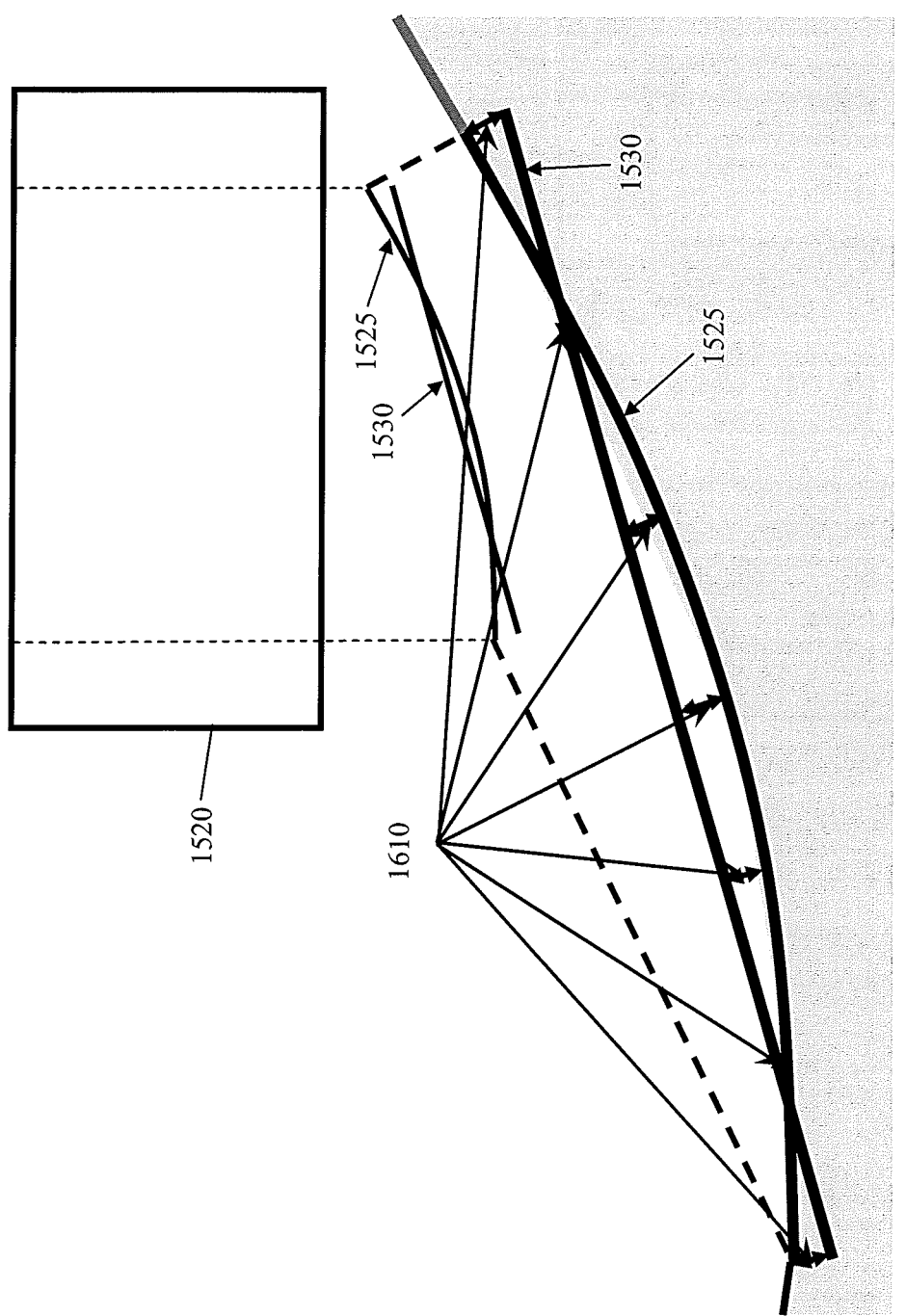

As depicted in FIG. 16, the scanner determines the focus target 1530 by minimizing the distance between the shot surface 1525 and the PO focus plane. For example, vectors 1610 represent deviations between the focus target 1530 and the shot surface 1525, and are referred to as shot surface excursions 1610. Starting with the shot surface 1525, the scanner determines a focus target 1530 by identifying a straight line that minimizes the sum of the absolute values of the shot surface excursions. In particular embodiments, and as depicted in FIG. 17, the scanner determines the respective focus target 1530 by fitting a first order line to the non-flat shot surface 1525. Although a single shot surface and focus target are shown, it is understood that the scanner performs this function for each respective shot surface along each trace of the wafer.

Figure 18:
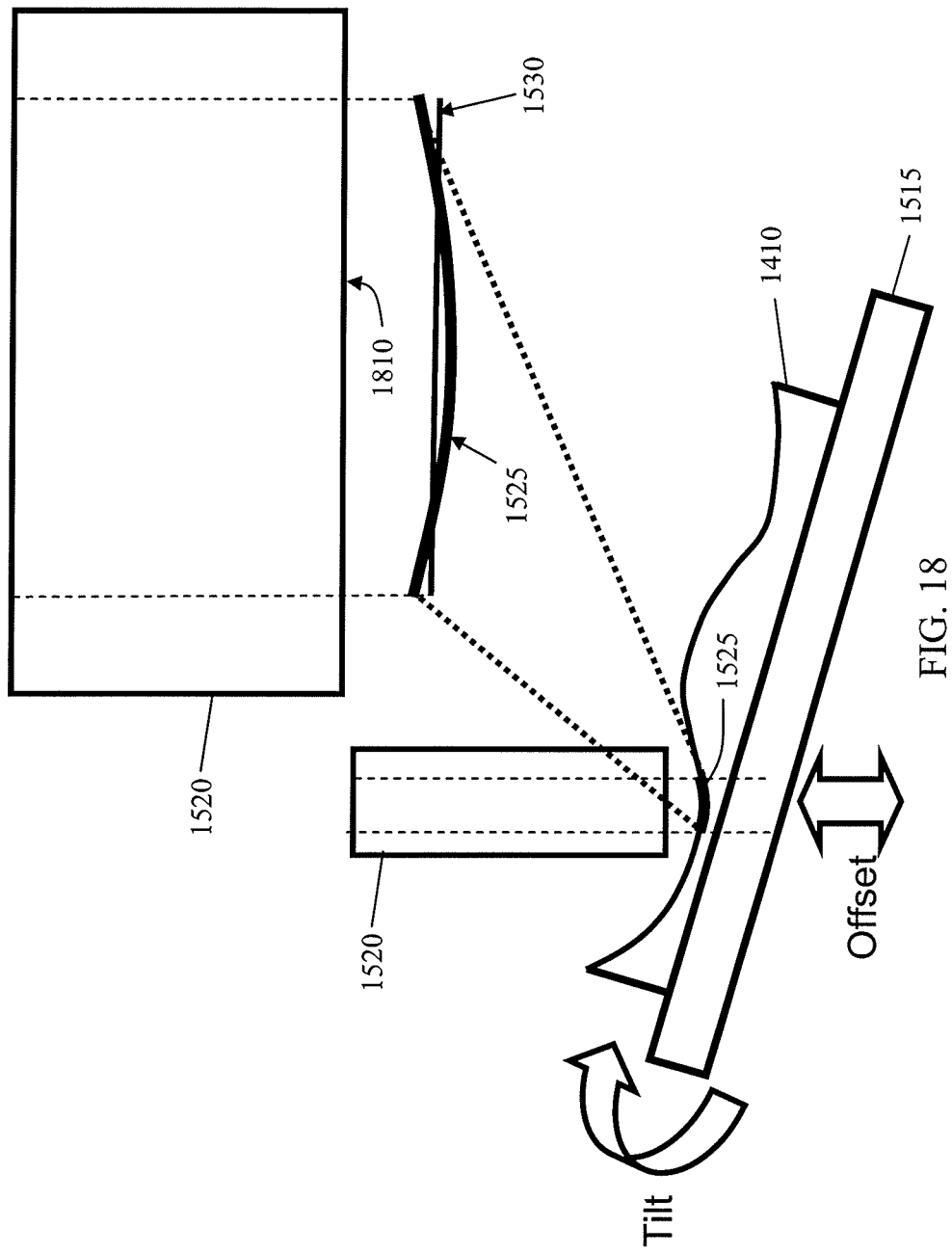

FIG. 18 depicts the auto focus operation. In embodiments, the scanner adjusts the tilt and offset of the wafer stage 1515 to substantially align the focus target 1530 with a focus plane 1810 of the PO 1520.

Figure 19:
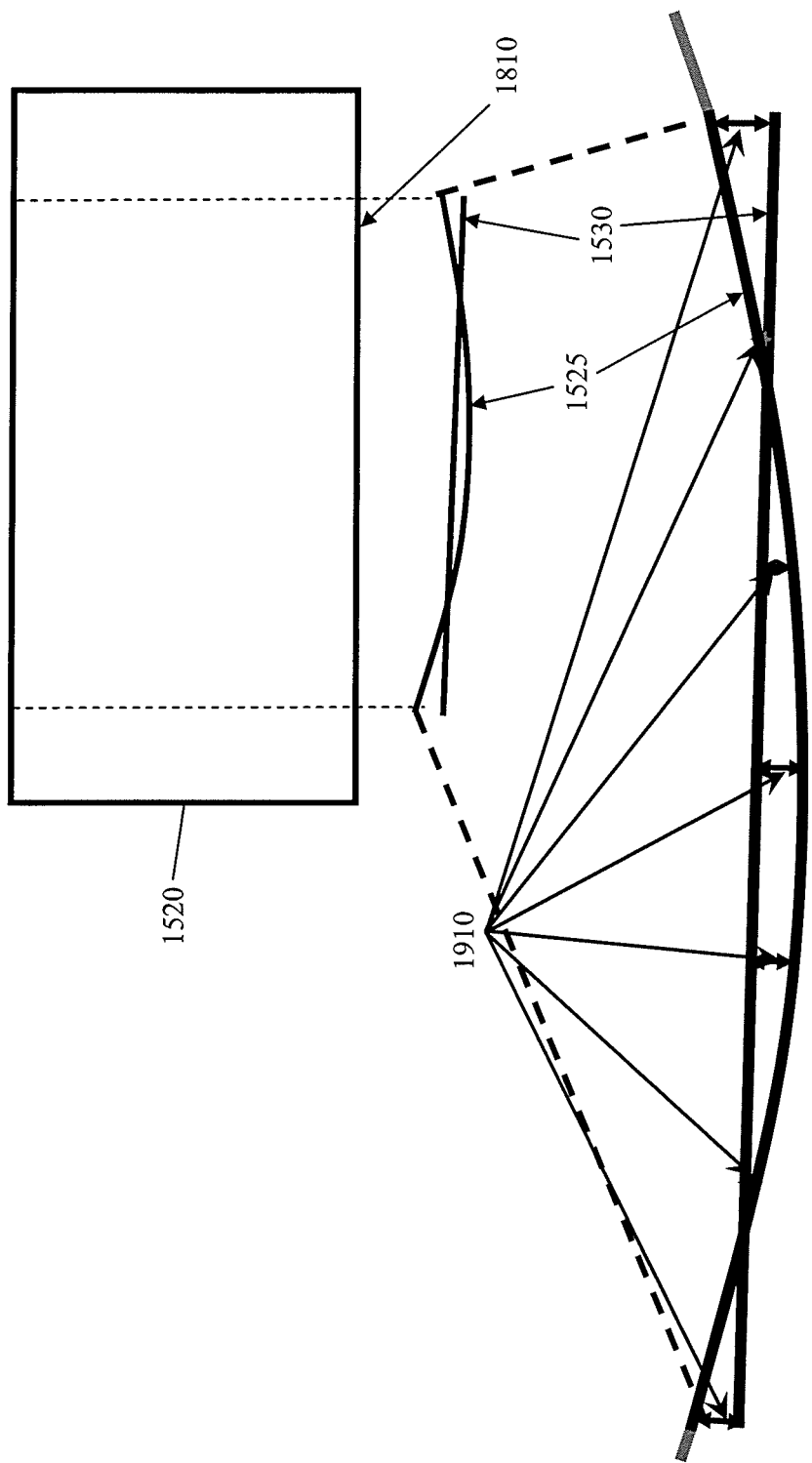

FIG. 19 shows topography target errors 1910 in accordance with aspects of the invention. As described above, the scanner autofocus operation aims to align the AF target plane 1530 with the PO focus plane 1810. The orientation and position of the AF target plane 1530 determines the wafer stage tilt and offset to substantially align the shot surface relative to the PO. The scanner calculates the topography target errors after performing the wafer stage tilt and offset. In embodiments, the topography target errors are determined as the difference between the AF target plane 1530 and the shot surface 1525.

Figure 20:
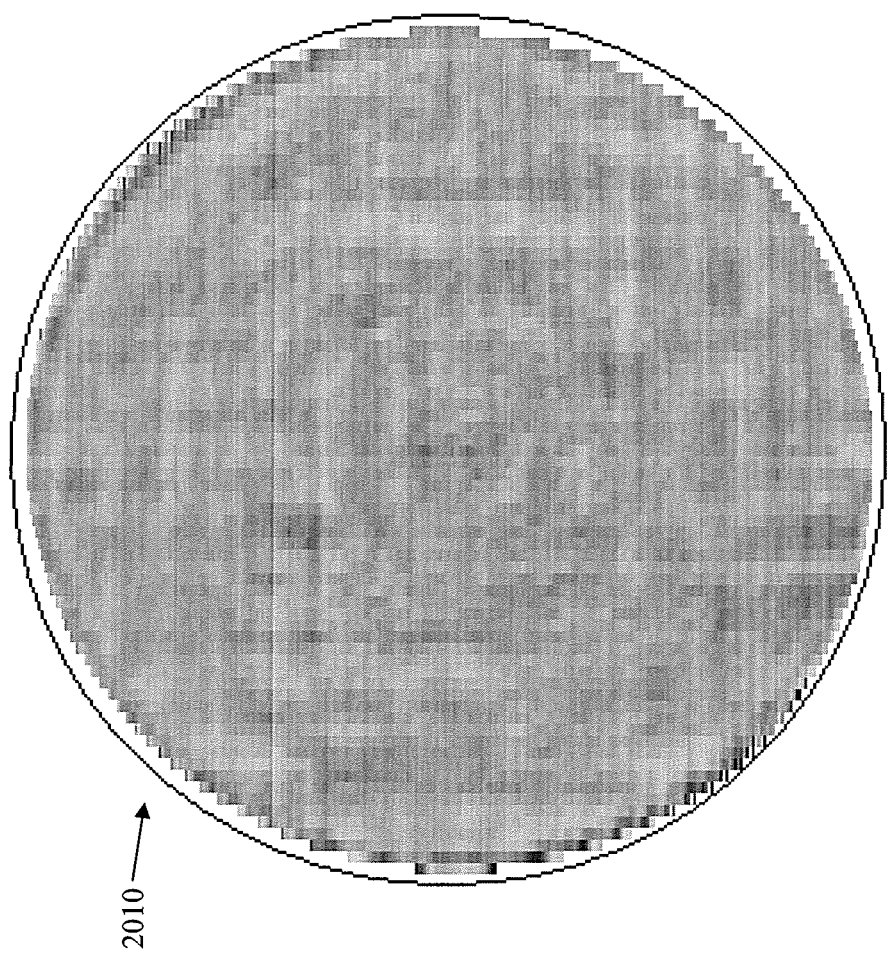

FIG. 20 shows a plan view of a graph 2010 of topography target errors from an entire wafer, in which different shades depict different amounts of topography target error at particular shot surfaces. In embodiments, the topography target errors are wafer specific, are impacted by the particular process, and are recorded by the AF sensor prior to wafer exposure.

Figure 21:
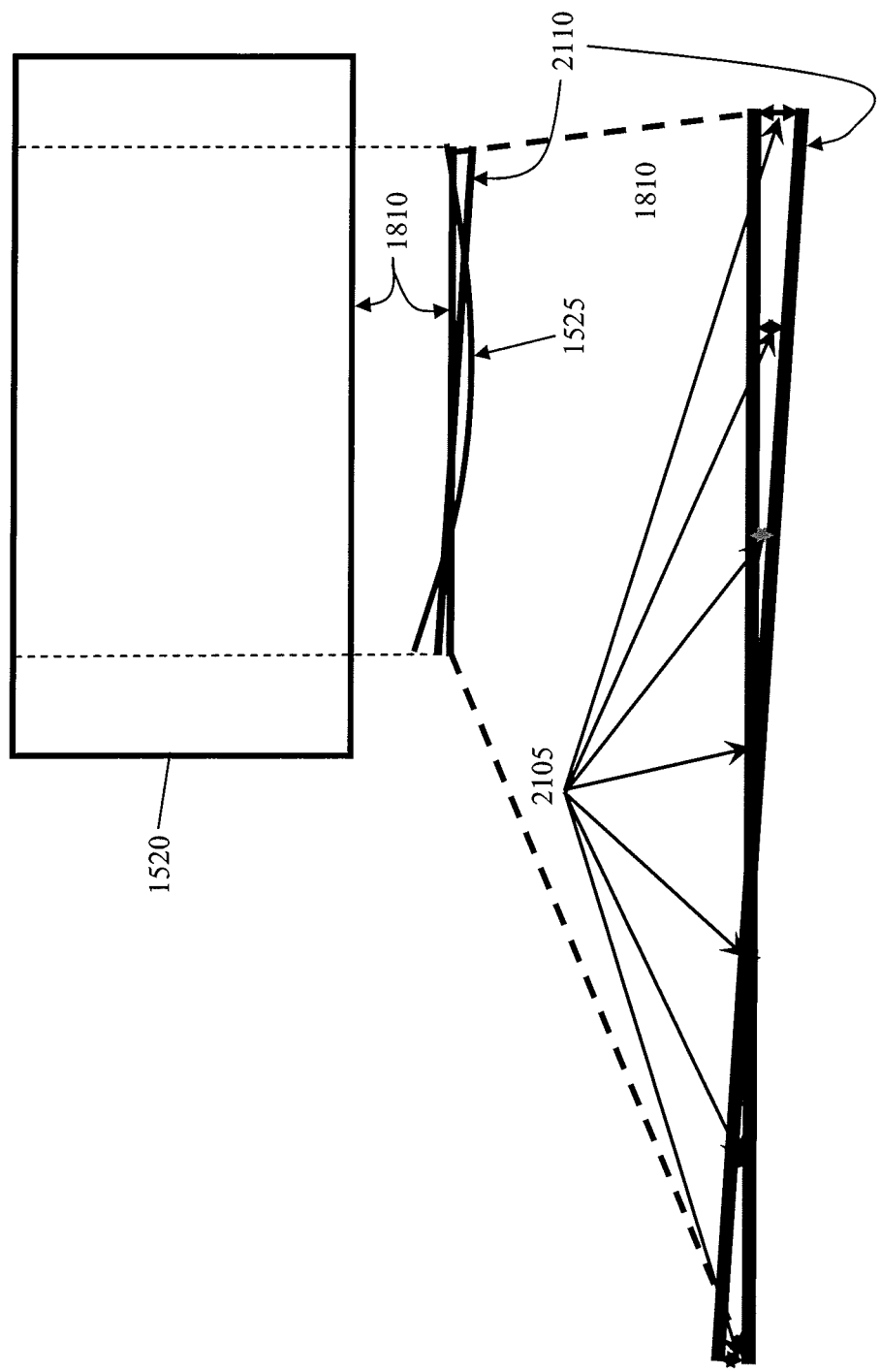
Figure 22:
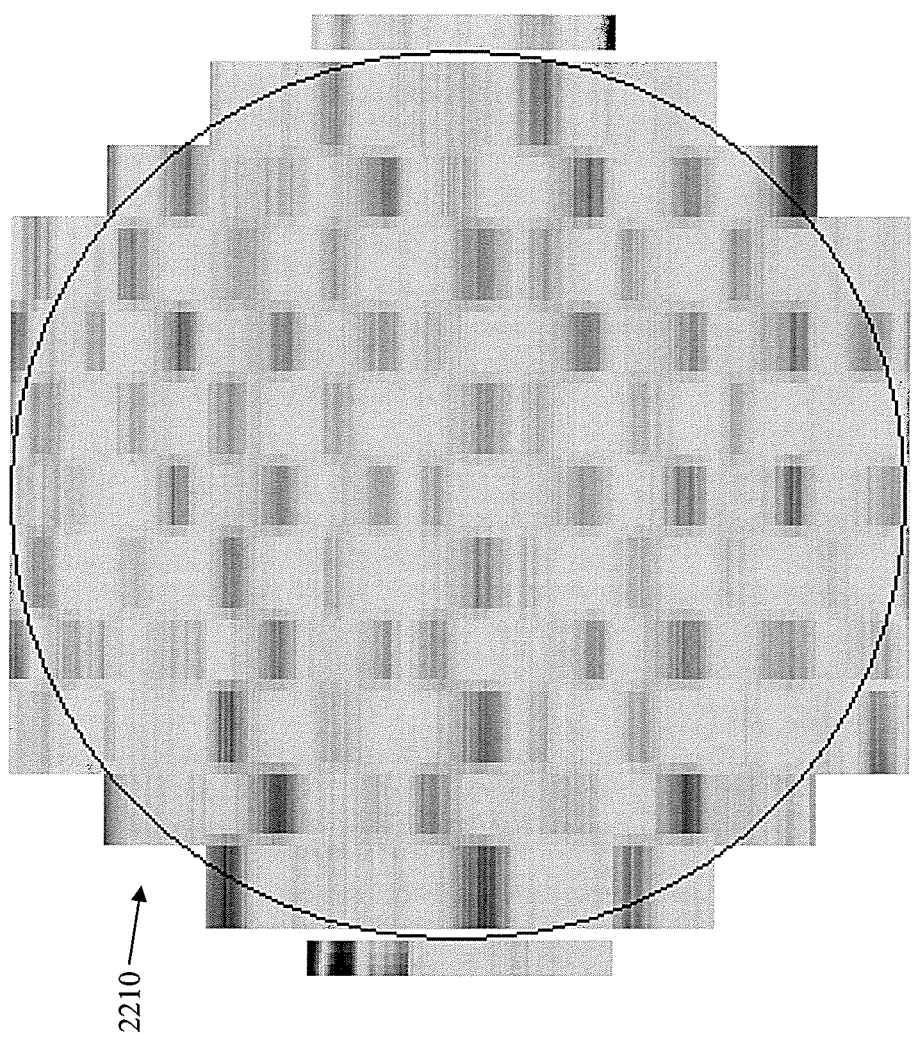

FIG. 21 depicts stage trajectory errors 2105 in accordance with aspects of the invention. As described above, the scanner autofocus operation aims to align the AF target plane with the PO focus plane 1810. However, exact alignment of the AF target plane with the PO focus plane 1810 is rarely achieved, and in actuality the AF target plane typically lies in a plane 2110 that is slightly misaligned to the PO focus plane 1810. Deviations between the actual AF target plane 2110 with the PO focus plane 1810 are referred to as stage trajectory errors 2105. In embodiments, the stage trajectory errors are recorded by the "Z" position sensors of the scanner. FIG. 22 shows a plan view of a graph 2210 of stage trajectory errors for a wafer. In embodiments, the stage trajectory errors are determined by the stage operations as monitored by the WTD.

Figure 23:
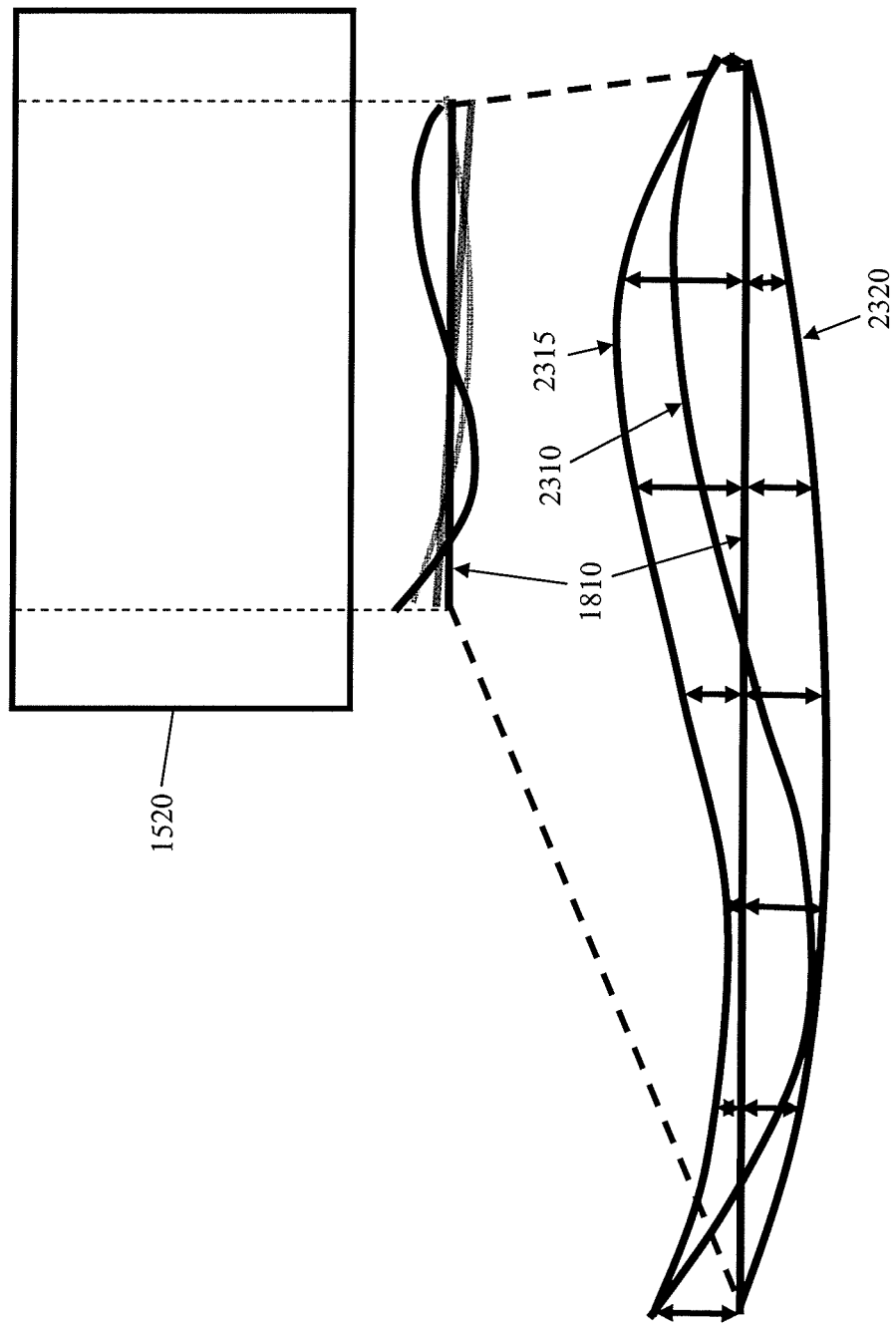
Figure 24:
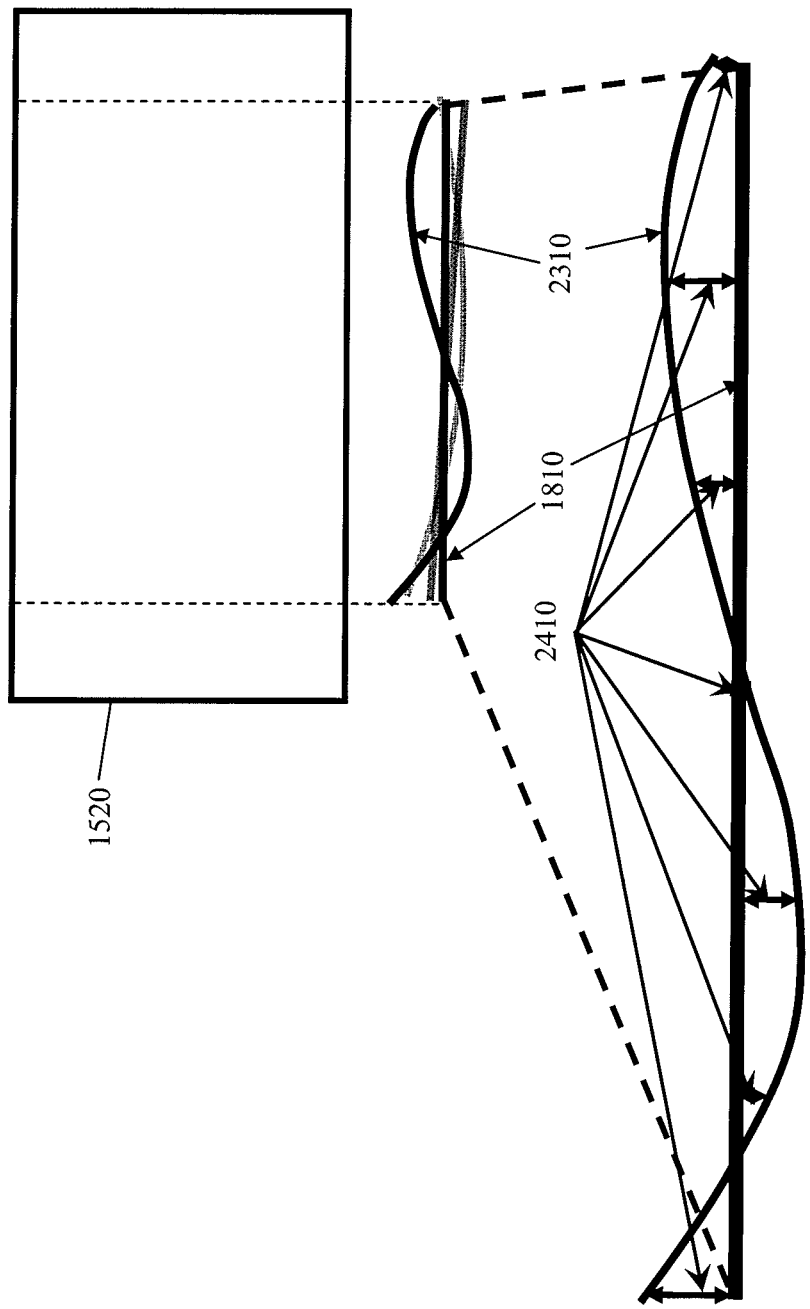

Image plane excursions are a third component of the overall image defocus. Image plane excursions arise from image curvature of the PO 1520. As depicted in FIG. 23, image curvature 2310 includes two components: Petzval curvature 2315 and image bending 2320. Petzval curvature 2315 is an optical aberration that remains constant along the scan, and which can be calculated or measured using known techniques. Image bending 2320 is caused by reticle sag and may be variable along the scan. FIG. 23 shows that the image curvature 2310 is a vector sum of the Petzval curvature 2315 and image bending 2320 deviations from the PO focus plane 1810 along the PO focus plane 1810. The image curvature 2310 results in the image plane where images are formed being different from the PO focus plane. The discrete differences are quantified as image plane excursions 2410 depicted in FIG. 24. In embodiments, the image plane excursion is specific to the imaging conditions, impacted by the imaging setup, and composed of Petzval curvature and reticle image bending contributions.

Figure 25:
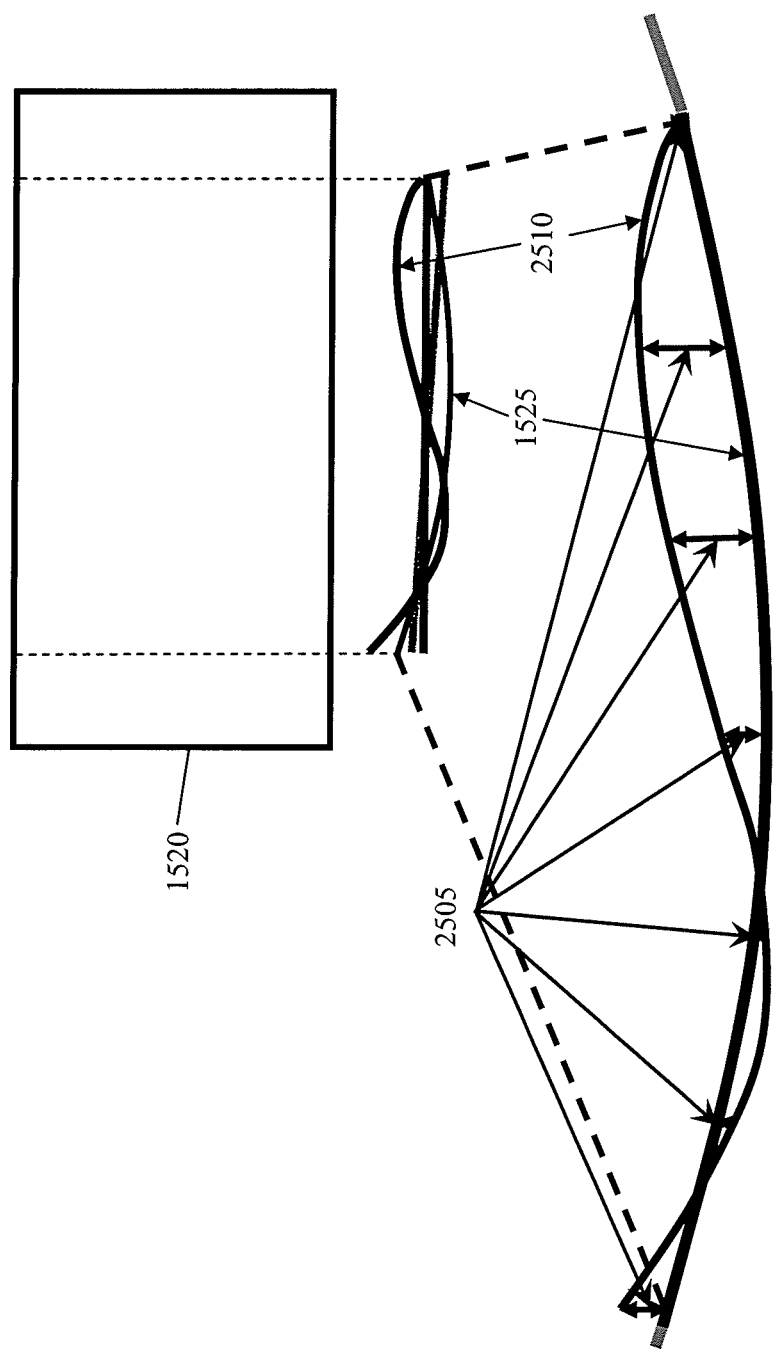
Figure 26:
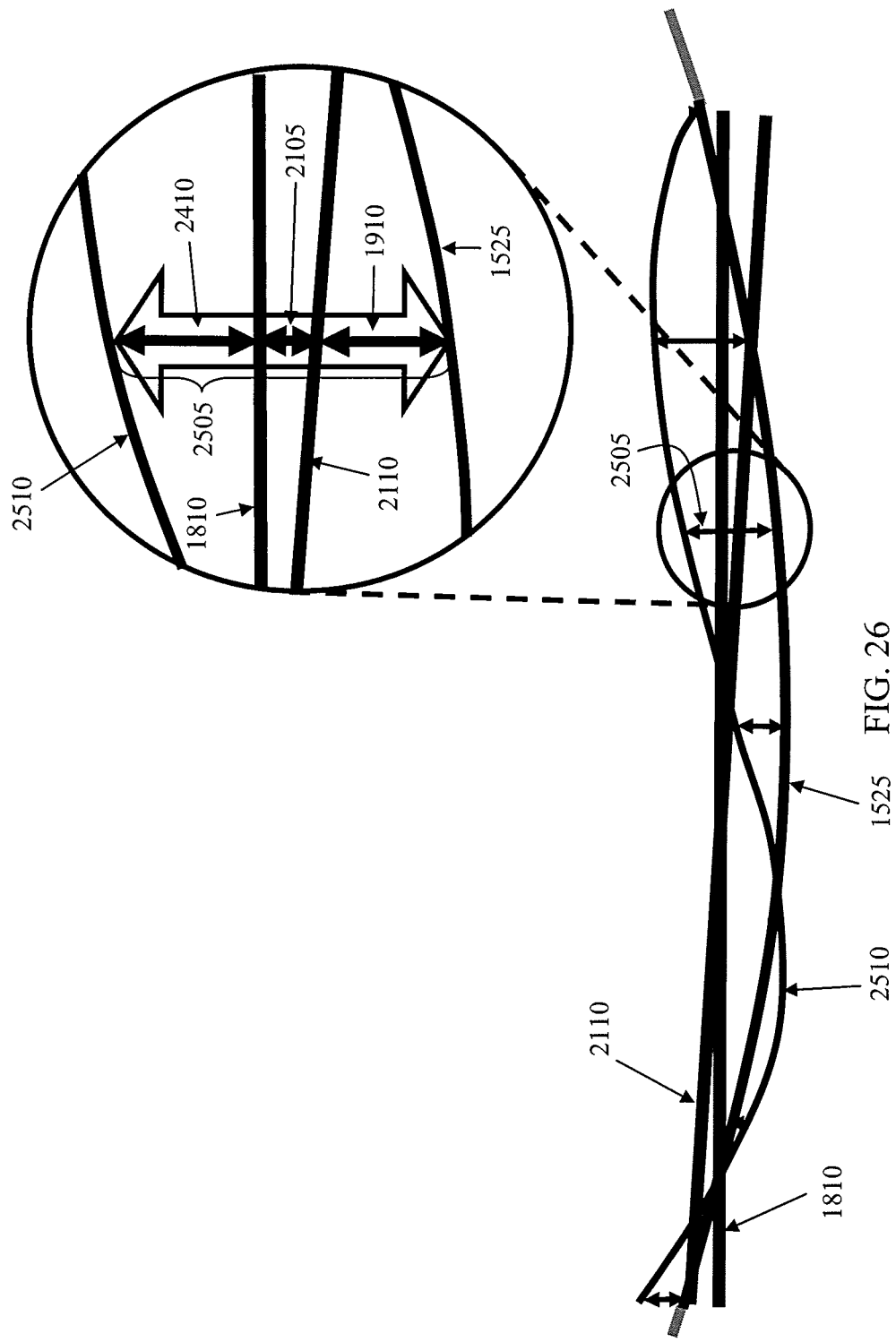

According to aspects of the invention, the image defocus 2505 is the distance from the wafer surface 1525 to the field curvature 2510, as shown in FIG. 25. In embodiments, the image defocus 2505 is a vector sum of topography target errors 1910, stage trajectory errors 2105, and image plane excursions 1810 from the projection optic (PO) focus plane 1810, as depicted in FIG. 26. In particular embodiments, the sum of topography target errors and the stage trajectory errors is relative to scanner zero-defocus. Additionally, the image plane excursions from the PO focus plane are calibrated relative to scanner zero-defocus.

According to aspects of the invention, using the methodology described with respect to FIGS. 14-26, a value of image defocus may be determined for any location (e.g., shot surface) on the wafer. By determining a plurality of image defocus values at a plurality of locations, and by linking the each respective image defocus value with a corresponding location, an image defocus map (e.g., defocus map 1135) may be constructed.

Exemplary Photolithographic Apparatus
Implementing Aspects of the Invention

Figure 27:
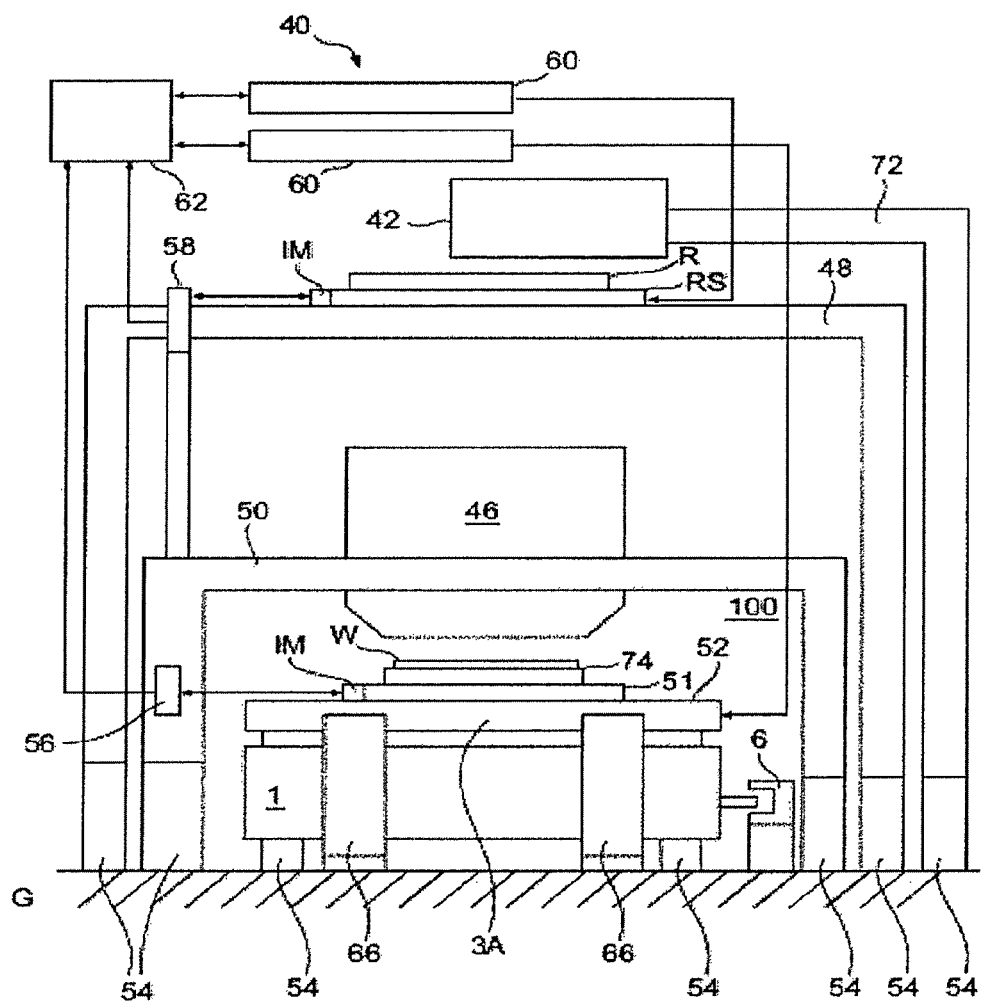
FIG. 27 is a schematic view illustrating a photolithography apparatus according to aspects of the invention.

FIG. 27 is a schematic view illustrating a photolithography apparatus 40 (e.g., scanner, imaging system, exposure apparatus, etc.) in accordance with the present invention. The wafer positioning stage 52 includes a wafer stage 51, a base 1, a following stage and following stage base 3A, and an additional actuator 6. The wafer stage 51 comprises a wafer chuck that holds a wafer W and an interferometer minor IM. The exposure apparatus can also include an encoder to measure stage position. The base 1 is supported by a plurality of isolators 54 (or a reaction frame). The isolators 54 may include a gimbal air bearing. The following stage base 3A is supported by a wafer stage frame (reaction frame) 66. The additional actuator 6 is supported on the ground G through a reaction frame. The wafer positioning stage 52 is structured so that it can move the wafer stage 51 in multiple (e.g., three to six) degrees of freedom under precision control by a drive control unit and system controller, and position and orient the wafer W as desired relative to the projection optics 46. In this embodiment, the wafer stage 51 has six degrees of freedom by utilizing the Z direction forces generated by the x motor and the y motor of the wafer positioning stage 52 to control a leveling of the wafer W. However, a wafer table having three degrees of freedom (Z, θx, θy) or six degrees of freedom can be attached to the wafer stage 51 to control the leveling of the wafer. The wafer table includes the wafer chuck, at least three voice coil motors (not shown), and bearing system. The wafer table is levitated in the vertical plane by the voice coil motors and supported on the wafer stage 51 by the bearing system so that the wafer table can move relative to the wafer stage 51.

The reaction force generated by the wafer stage 51 motion in the X direction can be canceled by motion of the base 1 and the additional actuator 6. Further, the reaction force generated by the wafer stage motion in the Y direction can be canceled by the motion of the following stage base 3A.

An illumination system 42 is supported by a frame 72. The illumination system 42 projects radiant energy (e.g., light) through a mask pattern on a reticle R that is supported by and scanned using a reticle stage. Alternatively, in the case of systems using extreme ultraviolet (EUV) radiation, radiant energy is reflected by the reticle R. The reticle stage may have a reticle coarse stage for coarse motion and a reticle fine stage for fine motion. In this case, the reticle coarse stage corresponds to the translation stage table 100, with one degree of freedom. The reaction force generated by the motion of the reticle stage can be mechanically released to the ground through a reticle stage frame and the isolator 54, in accordance with the structures described in JP Hei 8-330224 and U.S. Pat. No. 5,874,820, the entire contents of both of which are incorporated by reference herein. The light is focused by a projection optical system (lens assembly) 46 supported on a projection optics frame and released to the ground through isolator 54. The lens assembly 46 may include transmitting glass elements (refractive), reflecting mirrors (reflective) or a combination of the two (catadioptric).

An interferometer 56 is supported on the projection optics frame and detects the position of the wafer stage 51 and outputs the information of the position of the wafer stage 51 to the system controller. A second interferometer 58 is supported on the projection optics frame and detects the position of the reticle stage and outputs the information of the position to the system controller. The system controller controls a drive control unit to position the reticle R at a desired position and orientation relative to the wafer W or the projection optics 46.

There are a number of different types of photolithographic devices which can implement the present invention. For example, apparatus 40 may comprise an exposure apparatus that can be used as a scanning type photolithography system, which exposes the pattern from reticle R onto wafer W with reticle R and wafer W moving synchronously. In a scanning type lithographic device, reticle R is moved perpendicular to an optical axis of projection optics 46 by reticle stage and wafer W is moved perpendicular to an optical axis of projection optics 46 by wafer positioning stage 52. Scanning of reticle R and wafer W occurs while reticle R and wafer W are moving synchronously but in opposite directions along mutually parallel axes parallel to the x-axis.

Alternatively, exposure apparatus 40 can be a step-and-repeat type photolithography system that exposes reticle R while reticle R and wafer W are stationary. In the step and repeat process, wafer W is in a fixed position relative to reticle R and projection optics 46 during the exposure of an individual field. Subsequently, between consecutive exposure steps, wafer W is consecutively moved by wafer positioning stage 52 perpendicular to the optical axis of projection optics 46 so that the next field of semiconductor wafer W is brought into position relative to projection optics 46 and reticle R for exposure. Following this process, the images on reticle R are sequentially exposed onto the fields of wafer W so that the next field of semiconductor wafer W is brought into position relative to projection optics 46 and reticle R.

However, the use of apparatus 40 provided herein is not limited to a photolithography system for semiconductor manufacturing. Apparatus 40 (e.g., an exposure apparatus), for example can be used as an LCD photolithography system that exposes a liquid crystal display device pattern onto a rectangular glass plate or a photolithography system for manufacturing a thin film magnetic head.

In the illumination system 42, the illumination source can be g-line (436 nm), i-line (365 nm), KrF excimer laser (248 nm), ArF excimer laser (193 nm), $F_2$ laser (157 nm) or EUV (13.5 nm).

With respect to projection optics 46, when far ultra-violet rays such as the excimer laser is used, glass materials such as quartz and fluorite that transmit far ultra-violet rays are preferably used. When the $F_2$ type laser, projection optics 46 should preferably be either catadioptric or refractive (a reticle should also preferably be a reflective type). When extreme ultra-violet (EUV) rays or x-rays are used the projection optics 46 should preferably be fully reflective, as should the reticle.

Also, with an exposure device that employs vacuum ultra-violet radiation (VUV) of wavelength 200 nm or shorter, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No. 10-20195 and its counterpart U.S. Pat. No. 5,835,275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689,377 as well as Japanese Patent Application Disclosure No. 10-3039 and its counterpart U.S. Pat. No. 5,892,117 also use a reflecting-refracting type of optical system incorporating a concave minor, etc., but without a beam splitter, and can also be employed with this invention. The disclosures in the above-mentioned U.S. patents, as well as the Japanese patent applications published in the Office Gazette for Laid-Open Patent Applications are incorporated herein by reference in their entireties.

Further, in photolithography systems, when linear motors that differ from the motors shown in the above embodiments (see U.S. Pat. No. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference in their entireties.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage, and the other unit is mounted on the moving plane side of the stage.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference in their entireties.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Figure 28:
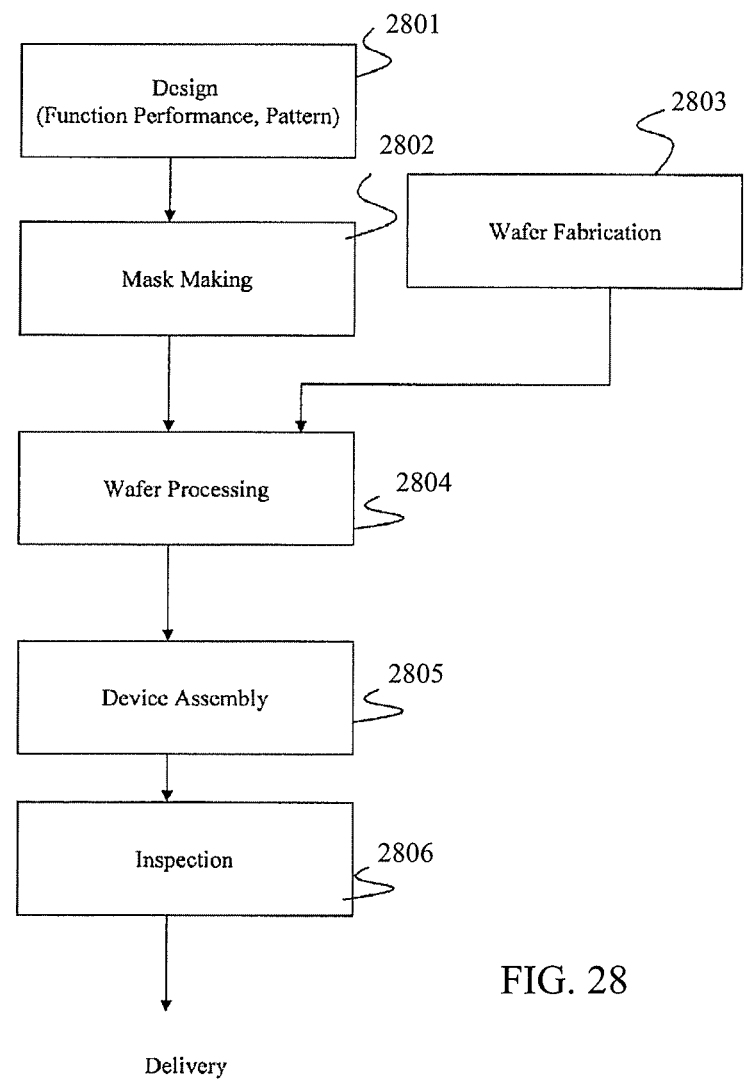
FIG. 28 is a flowchart showing semiconductor device fabrication in accordance with aspects of the invention.

Further, semiconductor devices can be fabricated using the above described systems, by the process shown generally in FIG. 28. In step 2801 the device's function and performance characteristics are designed. Next, in step 2802, a mask (reticle) having a pattern is designed according to the previous designing step, and in a parallel step 2803, a wafer is made from a silicon material. The mask pattern designed in step 2802 is exposed onto the wafer from step 2803 in step 2804 by a photolithography system described hereinabove consistent with the principles of the present invention. For example, the exposing the mask pattern onto the wafer may comprise one or more of the processes of the invention described above with respect to FIGS. 11A-13. In step 2805, the semiconductor device is assembled (including the dicing process, bonding process and packaging process), then finally the device is inspected in step 2806.

Figure 29:
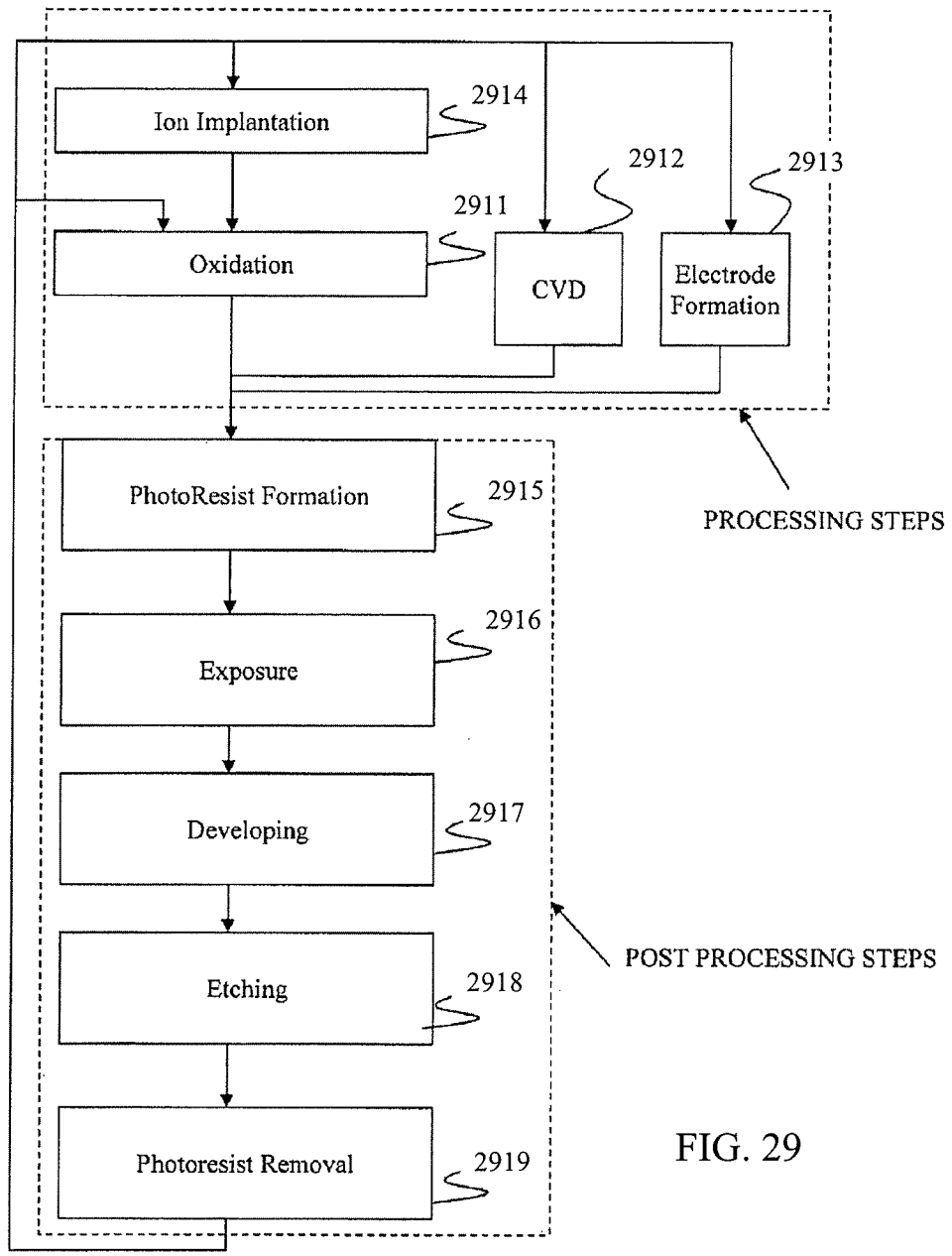
FIG. 29 is a flow chart showing wafer processing in accordance with aspects of the invention.

FIG. 29 illustrates a detailed flowchart example of the above-mentioned step 1304 in the case of fabricating semiconductor devices. In step 2911 (oxidation step), the wafer surface is oxidized. In step 2912 (CVD step), an insulation film is formed on the wafer surface. In step 2913 (electrode formation step), electrodes are formed on the wafer by vapor deposition. In step 2914 (ion implantation step), ions are implanted in the wafer. The above-mentioned steps 2911-2914 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially in step 2915 (photoresist formation step), photoresist is applied to a wafer. Next, in step 2916 (exposure step), the above-mentioned exposure apparatus is used to transfer the circuit pattern of a mask (reticle) to a wafer. Step 2916, the exposure step, may comprise one or more of the processes of the invention described above with respect to FIGS. 11A-13. Then, in step 2917 (developing step), the exposed wafer is developed, and in step 2918 (etching step), parts other than residual photoresist (exposed material surface) are removed by etching. In step 2919 (photoresist removal step), unnecessary photoresist remaining after etching is removed. Multiple circuit patterns are formed by repetition of these pre-processing and post-processing steps.

The foregoing examples have been provided for the purpose of explanation and are in no way to be construed as limiting of the present invention. While the present invention has been described with reference to exemplary embodiments, it is understood that the words, which have been used herein, are words of description and illustration, rather than words of limitation. Changes may be made, within the purview of the appended claims, as presently stated and as amended, without departing from the scope and spirit of the present invention in its aspects. Although the present invention has been described herein with reference to particular means, materials and embodiments, the present invention is not intended to be limited to the particulars disclosed herein; rather, the present invention extends to all functionally equivalent structures, methods and uses, such as are within the scope of the appended claims.

What is claimed:

1. A method of predicting pattern critical dimensions in a lithographic exposure process, comprising:
defining relationships between critical dimension, defocus, and dose;
performing at least one exposure run in creating a pattern on a wafer;
creating a dose map;
creating a defocus map; and
predicting, by a computer device, pattern critical dimensions based on the relationships, the dose map, and the defocus map,
wherein the dose map is created based on dose integrator data; and
the defocus map is created based on wafer table direct interferometer data, total field deviation data, and focus correction data.

2. The method of claim 1, further comprising comparing the predicted pattern critical dimensions to design specification critical dimensions.

3. The method of claim 1, wherein the predicting is performed in situ.

4. The method of claim 1, wherein the predicting is performed during an exposure step of a lithographic process.

5. The method of claim 4, wherein the predicting is performed without using metrology to measure the pattern critical dimensions.

6. The method of claim 1, further comprising creating at least one single exposure critical dimension map from the predicted pattern critical dimensions.

7. The method of claim 6, further comprising creating a double pattern space map and a double pattern line map based on the at least one single exposure critical dimension map and one of a spacer map and an overlay map.

8. The method of claim 1, further comprising using the predicted pattern critical dimensions to perform at least one of monitoring performance of a scanner during the at least one exposure run, troubleshooting the scanner, and tuning the scanner.

9. The method of claim 1, wherein the dose map and defocus map are created using data obtained during the at least one exposure run.

10. The method of claim 1, wherein the defocus map is created based on a vector sum of topography target errors, stage trajectory errors, and image plane excursions.

11. The method of claim 1, wherein the predicting the pattern critical dimensions comprises applying a blur correction based on at least one of dose integrator data and scan synchronization data.

12. The method of claim 1, wherein the relationships between critical dimension, defocus, and dose comprise sets of Bossung curves.

13. The method of claim 12, wherein the sets of Bossung curves are created using a combination of fitting some curves to data points determined using metrology, and modeling other curves based on scanner imaging attributes.

14. The method of claim 1, wherein the relationships between critical dimension, defocus, and dose are defined at plural different locations of a scanner slit.

15. A system for predicting pattern critical dimensions in a lithographic exposure process, comprising:
a computing device configured to:
create a dose map and a defocus map based on data from at least one exposure run that creates a pattern on a wafer; and
predict pattern critical dimensions based on the dose map, the defocus map, and predetermined relationships between critical dimension, defocus, and dose,
wherein the dose map is created based on dose integrator data; and the defocus map is created based on a vector sum of topography target errors, stage trajectory errors, and image plane excursions.

16. The system of claim 15, wherein the predicting is performed in situ without using metrology to measure the pattern critical dimensions.

17. The system of claim 15, wherein the computing device is configured to create at least one single exposure critical dimension map from the predicted pattern critical dimensions.

18. The system of claim 17, wherein the computing device is configured to create a double pattern space map and a double pattern line map based on the at least one single exposure critical dimension map and one of a spacer map and an overlay map.

19. The system of claim 15, wherein the relationships between critical dimension, defocus, and dose comprise sets of Bossung curves.

20. The system of claim 19, wherein the sets of Bossung curves are created using a combination of: fitting some curves to data points determined using metrology, and modeling other curves based on scanner imaging attributes.

21. The system of claim 19, wherein the relationships between critical dimension, defocus, and dose are defined at plural different locations of a scanner slit.

22. The system of claim 15, wherein the computing device receives the data from a scanner that performs the at least one exposure run.

23. A computer program product comprising program code stored in a computer readable medium that, when executed on a computing device, causes the computing device to:
   create a dose map and a defocus map based on data from at least one exposure run that creates a pattern on a wafer; and
   predict pattern critical dimensions based on the dose map, the defocus map, and predetermined relationships between critical dimension, defocus, and dose,
   wherein the dose map is created based on dose integrator data; and
   the defocus map is created based on a vector sum of topography target errors, stage trajectory errors, and image plane excursions.

24. The computer program product of claim 23, wherein the predicting is performed in situ without using metrology to measure the pattern critical dimensions.

25. The computer program product of claim 23, wherein the computing device is configured to create at least one single exposure critical dimension map from the predicted pattern critical dimensions.

26. The computer program product of claim 25, wherein the computing device is configured to create a double pattern space map and a double pattern line map based on the at least one single exposure critical dimension map and one of a spacer map and an overlay map.

27. The computer program product of claim 23, wherein the relationships between critical dimension, defocus, and dose comprise sets of Bossung curves.

28. The computer program product of claim 27, wherein the sets of Bossung curves are created using a combination of fitting some curves to data points determined using metrology, and modeling other curves based on scanner imaging attributes.

29. The computer program product of claim 27, wherein the relationships between critical dimension, defocus, and dose are defined at plural different locations of a scanner slit.

* * * * *